US006801989B2

(12) United States Patent
Johnson et al.

(10) Patent No.: US 6,801,989 B2
(45) Date of Patent: Oct. 5, 2004

(54) METHOD AND SYSTEM FOR ADJUSTING THE TIMING OFFSET BETWEEN A CLOCK SIGNAL AND RESPECTIVE DIGITAL SIGNALS TRANSMITTED ALONG WITH THAT CLOCK SIGNAL, AND MEMORY DEVICE AND COMPUTER SYSTEM USING SAME

(75) Inventors: Brian Johnson, Boise, ID (US); Ronnie M. Harrison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 09/896,030

(22) Filed: Jun. 28, 2001

(65) Prior Publication Data

US 2003/0005250 A1 Jan. 2, 2003

(51) Int. Cl.[7] .......................... G06F 1/12; G06F 12/00
(52) U.S. Cl. ................. 711/167; 713/400; 713/503
(58) Field of Search ..................... 711/167; 365/233; 713/400, 401, 503, 600

(56) References Cited

U.S. PATENT DOCUMENTS

| 3,633,174 A | 1/1972 | Griffin ................. 340/172.5 |
| 4,004,100 A | 1/1977 | Takimoto ................ 179/15 BS |
| 4,077,016 A | 2/1978 | Sanders et al. ................ 331/4 |
| 4,096,402 A | 6/1978 | Schroeder et al. ........... 307/362 |
| 4,404,474 A | 9/1983 | Dingwall .................... 307/260 |
| 4,481,625 A | 11/1984 | Roberts et al. .............. 370/85 |
| 4,508,983 A | 4/1985 | Allgood et al. ............. 307/577 |
| 4,511,846 A | 4/1985 | Nagy et al. ................ 328/164 |
| 4,514,647 A | 4/1985 | Shoji ....................... 307/269 |
| 4,524,448 A | 6/1985 | Hullwegen ................. 375/118 |
| 4,573,017 A | 2/1986 | Levine ...................... 327/114 |
| 4,600,895 A | 7/1986 | Landsman ................. 331/1 A |
| 4,603,320 A | 7/1986 | Farago ...................... 341/89 |

(List continued on next page.)

FOREIGN PATENT DOCUMENTS

| EP | 0 171 720 A2 | 2/1986 |
| EP | 0 295 515 A1 | 12/1988 |

(List continued on next page.)

OTHER PUBLICATIONS

Alvarez, J. et al. "A Wide–Bandwidth Low Voltage PLL for PowerPC™ Microprocessors" IEEE IEICE Trans. Electron., vol. E–78. No. 6, Jun. 1995, pp. 631–639.

Anonymous, "400MHz SLDRAM, 4M X 16 SLDRAM Pipelined, Eight Bank, 2.5 V Operation," SLDRAM Consortium Advance Sheet, published throughout the United States, pp. 1–22, no date given.

Anonymous, "Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

(List continued on next page.)

Primary Examiner—Gary Portka
(74) Attorney, Agent, or Firm—Dorsey & Whitney LLP

(57) ABSTRACT

A method and circuit adaptively adjust respective timing offsets of digital signals relative to a clock output along with the digital signals to enable a latch receiving the digital signals to store the signals responsive to the clock. A phase command for each digital signal is stored in an associated storage circuit and defines a timing offset between the corresponding digital signal and the clock. The clock is output along with each digital signal having the timing offset defined by the corresponding phase command and the digital signals are captured responsive to the clock and evaluated to determine if each digital signal was successfully captured. A phase adjustment command adjusts the value of each phase command. These operations are repeated for a plurality of phase adjustment commands until respective final phase commands allowing all digital signals to be successfully captured is determined and stored in the storage circuits.

66 Claims, 7 Drawing Sheets

U.S. PATENT DOCUMENTS

| | | | |
|---|---|---|---|
| 4,638,187 A | 1/1987 | Boler et al. | 307/451 |
| 4,638,451 A | 1/1987 | Hester et al. | 395/889 |
| 4,687,951 A | 8/1987 | McElroy | 307/269 |
| 4,727,541 A | 2/1988 | Mori et al. | 370/112 |
| 4,746,996 A | 5/1988 | Furuhata et al. | 360/36.2 |
| 4,773,085 A | 9/1988 | Cordell | 375/120 |
| 4,789,796 A | 12/1988 | Foss | 307/443 |
| 4,818,995 A | 4/1989 | Takahashi et al. | 341/94 |
| 4,893,087 A | 1/1990 | Davis | 328/14 |
| 4,902,986 A | 2/1990 | Lesmeister | 331/25 |
| 4,953,128 A | 8/1990 | Kawai et al. | 365/194 |
| 4,958,088 A | 9/1990 | Farah-Bakhsh et al. | 307/443 |
| 4,972,470 A | 11/1990 | Farago | 380/3 |
| 4,984,204 A | 1/1991 | Sato et al. | 365/189.11 |
| 4,984,255 A | 1/1991 | Davis et al. | 375/354 |
| 5,020,023 A | 5/1991 | Smith | 364/900 |
| 5,038,115 A | 8/1991 | Myers et al. | 331/2 |
| 5,062,082 A | 10/1991 | Choi | 365/230.06 |
| 5,075,569 A | 12/1991 | Branson | 307/270 |
| 5,086,500 A | 2/1992 | Greub | 395/550 |
| 5,087,828 A | 2/1992 | Sato et al. | 307/269 |
| 5,122,690 A | 6/1992 | Bianchi | 307/475 |
| 5,128,560 A | 7/1992 | Chern et al. | 307/475 |
| 5,128,563 A | 7/1992 | Hush et al. | 307/482 |
| 5,130,565 A | 7/1992 | Girmay | 307/265 |
| 5,134,311 A | 7/1992 | Biber et al. | 307/270 |
| 5,150,186 A | 9/1992 | Pinney et al. | 357/42 |
| 5,165,046 A | 11/1992 | Hesson | 307/270 |
| 5,168,199 A | 12/1992 | Huffman et al. | 315/370 |
| 5,179,298 A | 1/1993 | Hirano et al. | 307/443 |
| 5,182,524 A | 1/1993 | Hopkins | 330/149 |
| 5,194,765 A | 3/1993 | Dunlop et al. | 307/443 |
| 5,212,601 A | 5/1993 | Wilson | 360/51 |
| 5,220,208 A | 6/1993 | Schenck | 307/443 |
| 5,223,755 A | 6/1993 | Richley | 307/603 |
| 5,229,929 A | 7/1993 | Shimizu et al. | 363/98 |
| 5,233,314 A | 8/1993 | McDermott et al. | 331/17 |
| 5,233,564 A | 8/1993 | Ohshima et al. | 365/230.05 |
| 5,239,206 A | 8/1993 | Yanai | 307/272.2 |
| 5,243,703 A | 9/1993 | Farmwald et al. | 395/325 |
| 5,254,883 A | 10/1993 | Horowitz et al. | 307/443 |
| 5,256,989 A | 10/1993 | Parker et al. | 331/1 A |
| 5,257,294 A | 10/1993 | Pinto et al. | 375/120 |
| 5,268,639 A | 12/1993 | Gasbarro et al. | 324/158 R |
| 5,272,729 A | 12/1993 | Bechade et al. | 375/118 |
| 5,274,276 A | 12/1993 | Casper et al. | 307/443 |
| 5,276,642 A | 1/1994 | Lee | 365/189.04 |
| 5,278,460 A | 1/1994 | Casper | 307/296.5 |
| 5,281,865 A | 1/1994 | Yamashita et al. | 307/279 |
| 5,283,631 A | 2/1994 | Koerner et al. | 307/451 |
| 5,289,580 A | 2/1994 | Latif et al. | 395/275 |
| 5,295,164 A | 3/1994 | Yamamura | 375/120 |
| 5,304,952 A | 4/1994 | Quiet et al. | 331/1 A |
| 5,311,481 A | 5/1994 | Casper et al. | 365/230.06 |
| 5,311,483 A | 5/1994 | Takasugi | 365/233 |
| 5,313,431 A | 5/1994 | Uruma et al. | 365/230.05 |
| 5,315,269 A | 5/1994 | Fujii | 331/1 A |
| 5,315,388 A | 5/1994 | Shen et al. | 348/718 |
| 5,321,368 A | 6/1994 | Hoelzle | 328/63 |
| 5,337,285 A | 8/1994 | Ware et al. | 365/227 |
| 5,341,405 A | 8/1994 | Mallard, Jr. | 375/120 |
| 5,347,177 A | 9/1994 | Lipp | 307/443 |
| 5,347,179 A | 9/1994 | Casper et al. | 307/451 |
| 5,355,391 A | 10/1994 | Horowitz et al. | 375/36 |
| 5,361,002 A | 11/1994 | Casper | 327/530 |
| 5,367,649 A | 11/1994 | Cedar | 395/375 |
| 5,379,299 A | 1/1995 | Schwartz | 370/108 |
| 5,390,308 A | 2/1995 | Ware et al. | 395/400 |
| 5,400,283 A | 3/1995 | Raad | 365/203 |
| 5,402,389 A | 3/1995 | Flannagan et al. | 365/233 |
| 5,408,640 A | 4/1995 | MacIntyre et al. | 395/550 |
| 5,410,263 A | 4/1995 | Waizman | 327/141 |
| 5,416,436 A | 5/1995 | Rainard | 327/270 |
| 5,416,909 A | 5/1995 | Long et al. | 395/275 |
| 5,420,544 A | 5/1995 | Ishibashi | 331/11 |
| 5,428,311 A | 6/1995 | McClure | 327/276 |
| 5,428,317 A | 6/1995 | Sanchez et al. | 331/1 A |
| 5,430,408 A | 7/1995 | Ovens et al. | 327/407 |
| 5,430,676 A | 7/1995 | Ware et al. | 365/189.02 |
| 5,432,823 A | 7/1995 | Gasbarro et al. | 375/356 |
| 5,438,545 A | 8/1995 | Sim | 365/189.05 |
| 5,440,260 A | 8/1995 | Hayashi et al. | 327/278 |
| 5,440,514 A | 8/1995 | Flannagan et al. | 365/194 |
| 5,444,667 A | 8/1995 | Obara | 365/233 |
| 5,446,696 A | 8/1995 | Ware et al. | 365/222 |
| 5,448,193 A | 9/1995 | Baumert et al. | 327/156 |
| 5,451,898 A | 9/1995 | Johnson | 327/563 |
| 5,457,407 A | 10/1995 | Shu et al. | 326/30 |
| 5,465,076 A | 11/1995 | Yamauchi et al. | 331/179 |
| 5,473,274 A | 12/1995 | Reilly et al. | 327/159 |
| 5,473,575 A | 12/1995 | Farmwald et al. | 365/230.06 |
| 5,473,639 A | 12/1995 | Lee et al. | 375/376 |
| 5,485,490 A | 1/1996 | Leung et al. | 375/371 |
| 5,488,321 A | 1/1996 | Johnson | 327/66 |
| 5,489,864 A | 2/1996 | Ashuri | 327/161 |
| 5,497,127 A | 3/1996 | Sauer | 331/17 |
| 5,497,355 A | 3/1996 | Mills et al. | 365/230.08 |
| 5,498,990 A | 3/1996 | Leung et al. | 327/323 |
| 5,500,808 A | 3/1996 | Wang | 364/578 |
| 5,502,672 A | 3/1996 | Kwon | 365/189.05 |
| 5,506,814 A | 4/1996 | Hush et al. | 365/230.03 |
| 5,508,638 A | 4/1996 | Cowles et al. | 326/38 |
| 5,513,327 A | 4/1996 | Farmwald et al. | 395/309 |
| 5,532,714 A | 7/1996 | Knapp et al. | 345/114 |
| 5,539,345 A | 7/1996 | Hawkins | 327/150 |
| 5,544,124 A | 8/1996 | Zagar et al. | 365/230.08 |
| 5,544,203 A | 8/1996 | Casasanta et al. | 375/376 |
| 5,550,783 A | 8/1996 | Stephens, Jr. et al. | 365/233 |
| 5,552,727 A | 9/1996 | Nakao | 327/159 |
| 5,555,429 A | 9/1996 | Parkinson et al. | 395/800 |
| 5,557,224 A | 9/1996 | Wright et al. | 327/115 |
| 5,557,781 A | 9/1996 | Stones et al. | 395/550 |
| 5,563,546 A | 10/1996 | Tsukada | 327/408 |
| 5,568,075 A | 10/1996 | Curran et al. | 327/172 |
| 5,568,077 A | 10/1996 | Sato et al. | 327/199 |
| 5,572,557 A | 11/1996 | Aoki | 375/376 |
| 5,572,722 A | 11/1996 | Vogley | 395/555 |
| 5,574,698 A | 11/1996 | Raad | 365/230.06 |
| 5,576,645 A | 11/1996 | Farwell | 327/94 |
| 5,577,079 A | 11/1996 | Zenno et al. | 375/373 |
| 5,577,236 A | 11/1996 | Johnson et al. | 395/551 |
| 5,578,940 A | 11/1996 | Dillon et al. | 326/30 |
| 5,578,941 A | 11/1996 | Sher et al. | 326/34 |
| 5,579,326 A | 11/1996 | McClure | 371/61 |
| 5,581,197 A | 12/1996 | Motley et al. | 326/30 |
| 5,589,788 A | 12/1996 | Goto | 327/276 |
| 5,590,073 A | 12/1996 | Arakawa et al. | 365/185.08 |
| 5,594,690 A | 1/1997 | Rothenberger et al. | 365/189.01 |
| 5,614,855 A | 3/1997 | Lee et al. | 327/158 |
| 5,619,473 A | 4/1997 | Hotta | 365/238.5 |
| 5,621,340 A | 4/1997 | Lee et al. | 327/65 |
| 5,621,690 A | 4/1997 | Jungroth et al. | 365/200 |
| 5,621,739 A | 4/1997 | Sine et al. | 371/22.1 |
| 5,627,780 A | 5/1997 | Malhi | 365/185.09 |
| 5,627,791 A | 5/1997 | Wright et al. | 365/222 |
| 5,631,872 A | 5/1997 | Naritake et al. | 365/227 |
| 5,636,163 A | 6/1997 | Furutani et al. | 365/233 |
| 5,636,173 A | 6/1997 | Schaefer | 365/230.03 |
| 5,636,174 A | 6/1997 | Rao | 365/230.03 |
| 5,638,335 A | 6/1997 | Akiyama et al. | 365/230.03 |
| 5,646,904 A | 7/1997 | Ohno et al. | 365/233 |

| | | | |
|---|---|---|---|
| 5,652,530 A | 7/1997 | Ashuri | 326/93 |
| 5,657,289 A | 8/1997 | Hush et al. | 365/230.05 |
| 5,657,481 A | 8/1997 | Farmwald et al. | 395/551 |
| 5,663,921 A | 9/1997 | Pascucci et al. | 365/233 |
| 5,666,322 A | 9/1997 | Conkle | 365/233 |
| 5,668,763 A | 9/1997 | Fujioka et al. | 365/200 |
| 5,668,774 A | 9/1997 | Furatani | 365/233 |
| 5,673,005 A | 9/1997 | Pricer | 331/1 R |
| 5,675,274 A | 10/1997 | Kobayashi et al. | 327/158 |
| 5,675,588 A | 10/1997 | Maruyama et al. | 371/20.4 |
| 5,692,165 A | 11/1997 | Jeddeloh et al. | 395/551 |
| 5,694,065 A | 12/1997 | Hamasaki et al. | 327/108 |
| 5,708,611 A | 1/1998 | Iwamoto | 365/233 X |
| 5,712,580 A | 1/1998 | Baumgartner et al. | 327/12 |
| 5,719,508 A | 2/1998 | Daly | 327/12 |
| 5,737,342 A | 4/1998 | Ziperovich | 371/25.1 |
| 5,740,123 A | 4/1998 | Uchida | 365/233 |
| 5,751,665 A | 5/1998 | Tanoi | 368/120 |
| 5,767,715 A | 6/1998 | Marquis et al. | 327/159 |
| 5,768,177 A | 6/1998 | Sakuragi | 365/194 |
| 5,774,699 A | 6/1998 | Nagae | 395/551 |
| 5,778,214 A | 7/1998 | Taya et al. | 395/551 |
| 5,781,499 A | 7/1998 | Koshikawa | 365/233 |
| 5,784,422 A | 7/1998 | Heermann | 375/355 |
| 5,789,947 A | 8/1998 | Sato | 327/3 |
| 5,790,612 A | 8/1998 | Chengson et al. | 375/373 |
| 5,794,020 A | 8/1998 | Tanaka et al. | 395/552 |
| 5,805,931 A | 9/1998 | Morzano et al. | 395/884 |
| 5,812,619 A | 9/1998 | Runaldue | 375/376 |
| 5,822,314 A | 10/1998 | Chater-Lea | 370/337 |
| 5,831,929 A | 11/1998 | Manning | 365/233 |
| 5,841,707 A | 11/1998 | Cline et al. | 365/194 |
| 5,852,378 A | 12/1998 | Keeth | 327/171 |
| 5,872,959 A | 2/1999 | Nguyen et al. | 395/552 |
| 5,889,829 A | 3/1999 | Chiao et al. | 375/376 |
| 5,898,242 A | 4/1999 | Peterson | 327/278 |
| 5,898,674 A | 4/1999 | Mawhinney et al. | 370/247 |
| 5,917,760 A | 6/1999 | Millar | 365/194 |
| 5,920,518 A | 7/1999 | Harrison et al. | 365/233 |
| 5,926,047 A | 7/1999 | Harrison | 327/159 |
| 5,926,436 A | 7/1999 | Toda et al. | 365/236 |
| 5,940,608 A | 8/1999 | Manning | 395/551 |
| 5,940,609 A | 8/1999 | Harrison | 395/559 |
| 5,946,244 A | 8/1999 | Manning | 365/233 |
| 5,953,284 A | 9/1999 | Baker et al. | 365/233 |
| 5,964,884 A | 10/1999 | Partovi et al. | 713/503 |
| 5,990,719 A | 11/1999 | Dai et al. | 327/244 |
| 6,005,823 A | 12/1999 | Martin et al. | 365/230.08 |
| 6,011,732 A | 1/2000 | Harrison et al. | 365/194 |
| 6,014,042 A | 1/2000 | Nguyen | 327/3 |
| 6,016,282 A | 1/2000 | Keeth | 365/233 |
| 6,023,489 A | 2/2000 | Hatch | 375/208 |
| 6,026,050 A | 2/2000 | Baker et al. | 635/233 |
| 6,026,134 A | 2/2000 | Duffy et al. | 375/376 |
| 6,029,250 A | 2/2000 | Keeth | 713/400 |
| 6,038,219 A | 3/2000 | Mawhinney et al. | 370/242 |
| 6,067,592 A | 5/2000 | Farmwald et al. | 710/104 |
| 6,087,857 A | 7/2000 | Wang | 327/5 |
| 6,101,152 A | 8/2000 | Farmwald et al. | 365/233 |
| 6,101,197 A | 8/2000 | Keeth et al. | 370/517 |
| 6,105,157 A | 8/2000 | Miller | 714/744 |
| 6,147,905 A | 11/2000 | Seino | 365/185.11 |
| 6,147,916 A | 11/2000 | Ogura | 365/203 |
| 6,160,423 A | 12/2000 | Haq | 327/41 |
| 6,253,360 B1 | 6/2001 | Yoshiba | 716/6 |
| 6,262,921 B1 | 7/2001 | Manning | 365/194 |
| 6,269,451 B1 | 7/2001 | Mullarkey | 713/401 |
| 6,285,726 B1 | 9/2001 | Gaudet | 375/376 |
| 6,295,328 B1 | 9/2001 | Kim et al. | 375/376 |
| 6,298,450 B1 | 10/2001 | Liu et al. | 713/502 |
| 6,327,196 B1 | 12/2001 | Mullarkey | 365/194 |
| 6,327,318 B1 | 12/2001 | Bhullar et al. | 375/374 |
| 6,338,127 B1 | 1/2002 | Manning | 711/167 |
| 6,377,646 B1 | 4/2002 | Sha | 375/376 |
| 6,378,079 B1 | 4/2002 | Mullarkey | 713/401 |
| 6,499,111 B2 | 12/2002 | Mullarkey | 713/401 |

FOREIGN PATENT DOCUMENTS

| | | |
|---|---|---|
| EP | 0 406 786 A1 | 1/1991 |
| EP | 0 450 871 A2 | 10/1991 |
| EP | 0 476 585 A3 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A3 | 4/1996 |
| EP | 0 704 975 A1 | 4/1996 |
| EP | 0 767 538 A1 | 4/1997 |
| JP | 6-1237512 | 10/1986 |
| JP | 2-112317 | 4/1990 |
| JP | 4-135311 | 5/1992 |
| JP | 5-136664 | 6/1993 |
| JP | 5-282868 | 10/1993 |
| JP | 0-7319577 | 12/1995 |
| WO | WO 94/29871 | 12/1994 |
| WO | WO 95/22200 | 8/1995 |
| WO | WO 95/22206 | 8/1995 |
| WO | WO 96/10866 | 4/1996 |
| WO | WO 97/14289 | 4/1997 |
| WO | WO 97/42557 | 11/1997 |

OTHER PUBLICATIONS

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel x 1K Time Memory LSI with 1–ns/b Resolution", IEEE Journal of Solid–State Circuits, vol. 27, No. 3, M, 8107 Mar., 1992, No. 3, New York, US, pp. 359–364 and pp. 528–531.

Arai, Y. et al., "A Time Digitizer CMOS Gate–Array with a 250 ps Time Resolution", XP 000597207, IEEE Journal of Solid–State Circuits, vol. 31, No.2, Feb. 1996, pp. 212–220.

Aviram, A. et al., "Obtaining High Speed Printing on Thermal Sensitive Special Paper with a Resistive Ribbon Print Head", IBM Technical Disclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Donnelly, K. et al., "A 660 MB/s Interface Megacell Portable Circuit in 0.3 µm–0.7 µm CMOS ASIC", IEEE Journal of Solid–State Circuits, vol. 31, No. 12, Dec. 1996, pp. 1995–2001.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Gustavsion, David B., et al., "IEEE Standard for Scalable Coherent Interface (SCI)," IEEE Computer Society, IEEE Std. 1596–1992, Aug. 2, 1993.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6 µm CMOS SOG", IEEE Custom Integrated Circuits Conference, 1992, pp. 27.6.1–27.6.4.

Kim, B. et al., "A 30 MHz High–Speed Analog/Digital PLL in 2 µm CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U. et al., "A 30–ps Jitter, 3.6–µs Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Santos, D. et al., "CMOS Delay Locked Loop And Sub––Nanosecond Time–to–Digital Converter Chip", IEEE Nuclear Science Symposium and Medical Imaging Conference Record, vol. 1, Oct. 1995, pp. 289–291.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffer Using a Frequency– and Delay––Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol.E–79–C. No. 7, Jul. 1996, pp.898–904.

von Kaenel, V. et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

Kim, J. et al., "A 500Mb/s/pin Quadruple Data Rate SDRAM Interface Using a Skew Cancelleation Technique", IEEE International Solid–State Circuits Conference, Session 24 DRAM Paper WP 24.7, 2000, pp. 404–405.

Yang, K. et al., "A Scalable 32Gb/s Parallel Data Transceiver with On–Chip Timing Calibration Circuits", IEEE International Solid–State Circuits Conference, Session 24 High Speed I/O Paper TP 15.6, 2000, pp. 258–259.

Yeung, E. et al., A 2.4Gb/s/pin Simultaneous Bidirectional Parallel Link with Per Pin Skew Compensation, IEEE International Solid–State Circuits Conference, Session 15 High Speed I/O Paper TP 15.5, 2000, pp. 256–257.

METHOD AND SYSTEM FOR ADJUSTING THE TIMING OFFSET BETWEEN A CLOCK SIGNAL AND RESPECTIVE DIGITAL SIGNALS TRANSMITTED ALONG WITH THAT CLOCK SIGNAL, AND MEMORY DEVICE AND COMPUTER SYSTEM USING SAME

TECHNICAL FIELD

The present invention relates generally to semiconductor memories and other integrated circuit devices, and is directed, more particularly, to synchronizing digital signals being transferred over buses interconnecting such devices.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium III® and Pentium 4® microprocessors are currently available that operate at clock speeds of at least 400 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 1 GHz clock frequency may be mounted on a mother board having a 133 MHz clock frequency for controlling the system memory devices and other components.

Access to system memory is a frequent operation for the processor. The time required for the processor, operating, for example, at 1 GHz, to read data from or write data to a system memory device operating at, for example, 133 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as a synchronous link architecture. In the synchronous link architecture, the system memory may be coupled to the processor either directly through the processor bus or through a memory controller. Rather than requiring that separate address and control signals be provided to the system memory, synchronous link memory devices receive command packets that include both control and address information. The synchronous link memory device then outputs or receives data on a data bus that may be coupled directly to the data bus portion of the processor bus.

An example of a computer system 10 using the synchronous link architecture is shown in FIG. 1. The computer system 10 includes a processor 12 having a processor bus 14 coupled through a memory controller 18 and system memory bus 23 to three packetized or synchronous link dynamic random access memory ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 sends a data transfer command via the processor bus 14 to the memory controller 18, which, in turn, communicates with the memory devices 16a–c via the system memory bus 23 by sending the memory devices 16a–c command packets that contain both control and address information. Data is coupled between the memory controller 18 and the memory devices 16a–c through a data bus portion of the system memory bus 23. During a read operation, data is transferred from the SLDRAMs 16a–c over the memory bus 23 to the memory controller 18 which, in turn, transfers the data over the processor 14 to the processor 12. The processor 12 transfers write data over the processor bus 14 to the memory controller 18 which, in turn, transfers the write data over the system memory bus 23 to the SLDRAMs 16a–c. Although all the memory devices 16a–c are coupled to the same conductors of the system memory bus 23, only one memory device 16a–c at a time reads or writes data, thus avoiding bus contention on the memory bus 23. Bus contention is avoided by each of the memory devices 16a–c on the system memory 22 having a unique identifier, and the command packet contains an identifying code that selects only one of these components.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

A typical command packet CA<0:39> for an SLDRAM is shown in FIG. 2 and is formed by 4 packet words CA<0:9>, each of which contains 10 bits of data. As will be explained in more detail below, each packet word CA<0:9> is applied on a command-address bus CA including 10 lines CA0–CA9. In FIG. 2, the four packet words CA<0:9> comprising a command packet CA<0:39> are designated PW1–PW4. The first packet word $PW_1$ contains 7 bits of data identifying the packetized DRAM 16a–c that is the intended recipient of the command packet. As explained below, each of the packetized DRAMs is provided with a unique ID code that is compared to the 7 ID bits in the first packet word $PW_1$. Thus, although all of the packetized DRAMs 16a–c will receive the command packet, only the packetized DRAM 16a–c having an ID code that matches the 7 ID bits of the first packet word $PW_1$ will respond to the command packet.

The remaining 3 bits of the first packet word $PW_1$ as well as 3 bits of the second packet word $PW_2$ comprise a 6 bit command. Typical commands are read and write in a variety of modes, such as accesses to pages or banks of memory cells. The remaining 7 bits of the second packet word $PW_2$ and portions of the third and fourth packet words $PW_3$ and $PW_4$ comprise a 20 bit address specifying a bank, row and column address for a memory transfer or the start of a multiple bit memory transfer. In one embodiment, the 20 bit address is divided into 3 bits of bank address, 10 bits of row address, and 7 bits of column address. Although the command packet shown in FIG. 2 is composed of 4 packet words PW1–PW4 each containing up to 10 bits, it will be understood that a command packet may contain a lesser or greater number of packet words, and each packet word may contain a lesser or greater number of bits.

The memory device 16a is shown in block diagram form in FIG. 3. Each of the memory devices 16a–c includes a clock generator circuit 40 that receives a command clock signal CCLK and generates a large number of other clock and timing signals to control the timing of various operations in the memory device 16a. The memory device 16a also includes a command buffer 46 and an address capture circuit 48 which receive an internal clock signal ICLK, a command packet CA<0:9> on a 10 bit command-address bus CA, and a terminal 52 receiving a FLAG signal. A memory controller (not shown) or other device normally transmits the command packet CA<0:9> to the memory device 16a in synchronism with the command clock signal CCLK. As explained above, the command packet CA<0:39>, which generally includes four 10-bit packet words PW1–PW4, contains control and address information for each memory transfer. The FLAG signal identifies the start of a command packet, and also signals the start of an initialization sequence. The command buffer 46 receives the command packet from the command-address bus CA, and compares at least a portion of the command packet to identifying data from an ID register 56 to determine if the command packet is directed to the memory device 16a or some other memory device 16b, c. If the command buffer 46 determines that the command is directed to the memory device 16a, it then provides the command to a command decoder and sequencer 60. The command decoder and sequencer 60 generates a large number of internal control signals to control the operation of the memory device 16a during a memory transfer.

The address capture circuit 48 also receives the command packet from the command-address bus CA and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The row and column addresses are processed by row and column address paths, as will be described in more detail below.

One of the problems of conventional DRAMs is their relatively low speed resulting from the time required to precharge and equilibrate circuitry in the DRAM array. The SLDRAM 16a shown in FIG. 3 largely avoids this problem by using a plurality of memory banks 80, in this case eight memory banks 80a–h. After a read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108 which includes a read data path 110 and a write data path 112. The read data path 110 includes a read latch 120 that stores data from the I/O gating circuit 102.

In the memory device 16a shown in FIG. 3, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked through the read FIFO buffer 124 in response to a clock signal RCLK generated by the clock generator 40. The FIFO buffer 124 sequentially applies the 16-bit data words to a driver circuit 128 which, in turn, applies the 16-bit data words to a data bus DQ forming part of the processor bus 14 (see FIG. 1). The FIFO buffer 124 also applies two data clock signals DCLK0 and DCLK1 to the driver circuit 128 which, in turn, applies the data clock signals DCLK0 and DCLK1 on respective data clock lines 132 and 133. The data clocks DCLK0 and DCLK1 enable a device, such as the memory controller 18, reading data on the data bus DQ to be synchronized with the data. Particular bits in the command portion of the command packet CA0–CA9 determine which of the two data clocks DCLK0 and DCLK1 is applied by the driver circuit 128. It should be noted that the data clocks DCLK0 and DCLK1 are differential clock signals, each including true and complementary signals, but for ease of explanation, only one signal for each clock is illustrated and described.

The write data path 112 includes a receiver buffer 140 coupled to the data bus 130. The receiver buffer 140 sequentially applies 16-bit data words from the data bus DQ to four input registers 142, each of which is selectively enabled by a signal from a clock generator circuit 144. The clock generator circuit 144 generates these enable signals responsive to the selected one of the data clock signals DCLK0 and DCLK1. The memory controller or processor determines which data clock DCLK0 or DCLK1 will be utilized during a write operation using the command portion of a command packet applied to the memory device 16a. As with the command clock signal CCLK and command packet, the memory controller or other device (not shown) normally transmits the data to the memory device 16a in synchronism with the selected one of the data clock signals DCLK0 and DCLK1. The clock generator 144 is programmed during initialization to adjust the timing of the clock signal applied to the input registers 142 relative to the selected one of the data clock signals DCLK0 and DCLK1 so that the input registers 142 can capture the write data at the proper times. In response to the selected data clock DCLK0 or DCLK1, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

As mentioned above, an important goal of the synchronous link architecture is to allow data transfer between a processor or memory controller and a memory device to occur at a significantly faster rate. However, as the rate of data transfer increases, it becomes more difficult to maintain synchronization of signals transmitted between the memory controller 18 and the memory device 16a. For example, as mentioned above, the command packet CA<0:39> is normally transmitted from the memory controller 18 to the memory device 16a in synchronism with the command clock signal CCLK, and the read and write data are normally transferred between the memory controller 18 and the memory device 16a in synchronism with the selected one of the data clock signals DCLK0 and DCLK1. However, because of unequal signal delays and other factors, the command packet CA<0:39> may not arrive at the memory device 16a in synchronism with the command clock signal CCLK, and write and read data may not arrive at the memory device 16a and memory controller 18, respectively, in synchronism with the selected one of the data clock signals DCLK0 and DCLK1. Moreover, even if these signals are actually coupled to the memory device 16a and memory controller 18 in synchronism with each other, they may loose synchronism once they are coupled to circuits within these respective devices. For example, internal signals require time to propagate to various circuitry in the memory device 16a, differences in the lengths of signal routes can cause differences in the times at which signals reach the circuitry, and differences in capacitive loading of signal lines can also cause differences in the times at which signals reach the circuitry. These differences in arrival times can become significant at high speeds of operation and eventually limit the operating speed of the memory devices 16a and memory controller 18.

The problems associated with varying arrival times are exacerbated as timing tolerances become more restricted with higher data transfer rates. For example, if the internal clock ICLK derived from the command clock CCLK does not latch each of the packet words CA<0:9> comprising a command packet CA<0:39> at the proper time, errors in the operation of the memory device may result. Similarly, data errors may result during write operations if internal signals developed responsive to the data clocks DCLK0 and DCLK1 do not latch data applied on the data bus DQ at the proper time. During read operations, data errors may likewise result if internal signals in the memory controller 18 developed responsive to the data clock signals DCLK0 and DCLK1 from the memory device 16a do not latch read data applied on the data bus DQ at the proper time. Moreover, even if these respective clocks are initially synchronized, this synchronism may be lost over time during normal operation of the memory device 16a. Loss in synchronism may result from a variety of factors, including temperature variations in the environment in which the memory device 16a is operating, variations in the supply voltage applied to the memory device, and drift in operating parameters of components within the memory device.

One skilled in the art will understand that synchronization of the clock signals CCLK, DCLK0, and DCLK1 is being used to mean the adjusting of the timing of respective internal clock signals derived from these respective external clock signals so the internal clock signals can be used to latch corresponding digital signals at the proper times. For example, the command clock signal CCLK is synchronized when the timing of the internal clock signal ICLK relative to the command clock signal CCLK causes packet words CA<0:9> to be latched at the proper times.

To synchronize the command clock signals CCLK and the data clock signals DCLK0 and DCLK1 during write data operations, the memory controller 18 applies a test bit pattern and (FIG. 1) places the memory device 16a in a command and write data synchronization mode. During the synchronization mode, synchronization circuitry within the memory device 16a (not shown in FIG. 3) detects the applied bit pattern, places the device in the synchronization mode, and thereafter generates the necessary control signals to control components within the memory device to synchronize the clock signals CCLK, DCLK0, and DCLK1 from the controller 18. The data clock signals DCLK0 and DCLK1 must similarly be synchronized for read operations between the memory controller 18 and memory device 16a.

As mentioned above, an important goal of the synchronous link architecture is to allow data transfer between a processor and a memory device to occur at a significantly faster rate. It should be noted that the phrase "data transfer" as used herein includes all digital signals transferred to and from the memory device 16a, and thus includes signals on the CA and DQ busses as well as the FLAG signal. As the data transfer rate increases, it becomes more difficult to maintain the required timing between signals transmitted between the memory device 16a and the memory controller 18. For example, as mentioned above, the command packet CA<0:39> is normally transmitted to the memory device 16a in synchronization with the command clock signal CCLK, and the data is normally transmitted to the memory device 16a in synchronization with the selected one of the data clock signals DCLK0 and DCLK1. However, because of unequal signal delays and other factors, the command packet words CA<0:9> may not arrive at the memory device 16a in synchronization with the command clock signal CCLK, and the data packet words may not arrive at the memory device 16a in synchronization with the selected data clock signal DCLK0 or DCLK1. Moreover, even if these signals are actually coupled to the memory device 16a in synchronization with each other, this timing may be lost once they are coupled to circuits within the memory device. For example, internal signals require time to propagate to various circuitry in the memory device 16a, differences in the lengths of signal routes can cause differences in the times at which signals reach the circuitry, and differences in capacitive loading of signal lines can also cause differences in the times at which signals reach the circuitry. These differences in arrival times can become significant at high data transfer rates and eventually limit the operating speed of the packetized memory devices.

The problems associated with varying arrival times are exacerbated as timing tolerances become more restricted at higher data transfer rates. For example, if the internal clock ICLK derived from the command clock CCLK does not cause each of the packet words CA<0:9> comprising a command packet CA<0:39> to latch at the proper time, errors in the operation of the memory device may result. Thus, the timing or phase shift of the internal clock signal ICLK relative to the command clock signal CCLK must be adjusted such that the ICLK signal may be utilized to successfully latch each of the respective command signals CA<0>–CA<9> comprising a packet word CA<0:9>. This is true notwithstanding the varying arrival times of the respective command signals CA<0>–CA<9> within each packet word CA<0:9> relative to the ICLK signal.

Thus, for each of the clock signals CCLK, DCLK0, and DCLK1 the phase shift of respective internal clock signals derived from these respective external clock signals must be adjusted so the internal clock signals can be used to latch corresponding packet words at optimum times. For example, the phase shift of the internal clock signal ICLK relative to the command clock signal CCLK must be adjusted so that all command signals CA<0>–CA<9> in each packet word CA<0:9> are latched at the optimum time.

As the data transfer rate increases, the duration for which each signal CA<0>–CA<9> in a packet word CA<0:9> is valid decreases by a corresponding amount, as will be understood by one skilled in the art. More specifically, the data window or "eye" DE for each of the DQ<0>–DQ<15> signals decreases at higher data transfer rates. As understood by one skilled in the art, the data eye DE for each of the DQ<0>–DQ<9> signals defines the actual duration that each signal is valid after timing skew of the signal is considered. The timing skew of the DQ<0>–DQ<9> signals arises from a variety of timing errors such as loading on the lines of the DQ bus and the physical lengths of such lines. FIG. 4 is a timing diagram illustrating the data eyes DE for a number of the DQ<0>–DQ<9> signals. The solid lines indicate the ideal DQ<0>, DQ<1>, and DQ<9> signals, and the dashed lines indicate the worst case potential time skew for each of these signals. The data eyes DE of the DQ<0>, DQ<1>, and DQ<9> signals are defined by time intervals $t_0$–$t_3$, $t_1$–$t_4$, and $t_5$–$t_7$, respectively.

As data eyes DE of the applied signals DQ<0>–DQ<9> decrease at high data transfer rates, it is possible that one or more of these signals in each data packet word DQ<0:15> will have arrival times such that not all signals in a packet word are simultaneously valid at the memory device 16a, and thus cannot be successfully captured by the internal clock signal ICLK. For example, in FIG. 4, the data eye DE of the DQ<0> signal from times $t_0$–$t_3$ does not overlap the data eye of the DQ<15> signal from times $t_5$–$t_7$. In this situation, the signals DQ<0> and DQ<15> are not both valid at the memory device 16a at the same time so the packet word DQ<0:15> cannot be successfully captured responsive to the RCLK signal. The transition of the RCLK signal at time $t_2$ could successfully capture the DQ<0> and DQ<1> signals, but not the DQ<15> signal, and, conversely, the transition of the RCLK signal at time $t_6$ could successfully capture the DQ<15> signal but not the DQ<0> and DQ<1> signals, both of which have already gone invalid at time $t_6$.

There is a need for synchronizing respective data clock signals and corresponding data packet signals during the transfer of read data between packetized memory devices and a memory controller. Although the foregoing discussion is directed to synchronizing clock signals in packetized memory devices like SLDRAMs, similar problems exist in other types of integrated circuits as well, including other types of memory devices.

SUMMARY OF THE INVENTION

According to one aspect of the present invention, a method adaptively adjusts respective timing offsets of a plurality of digital signals relative to a clock signal being output along with the digital signals to enable a circuit receiving the digital signals successfully to each of the digital signals responsive to the clock signal. The method includes storing in a respective storage circuit associated with each digital signal a corresponding phase command. The phase command defines a particular timing offset between the corresponding digital signal and the clock signal. The clock signal is output along with each digital signal having the timing offset defined by the corresponding phase command. The digital signals are captured responsive to the clock signal and evaluated to determine if each digital signal was successfully captured. A phase adjustment command is generated to adjust the value of each phase command. The operations of outputting the clock signal through generating a phase adjustment command are repeated for a plurality of phase adjustment commands for each digital signal. A phase command that causes the digital signal to be successfully captured is then selected, and the selected phase command is stored in the storage circuit associated with the digital signal.

According to another aspect of the present invention, a read synchronization circuit adaptively adjusts respective timing offsets of a plurality of digital signals applied on respective signal terminals and an external data clock signal to enable an external device to latch the digital signals responsive to the external data clock signal. The read synchronization circuit includes a plurality of latch circuits, each latch circuit including an input, an output coupled to a respective signal terminal, and a clock terminal. Each latch circuit stores a signal applied on the input and providing the stored signal on the signal terminal responsive to a clock signal applied on the clock terminal. A plurality of phase command registers store phase commands with each register being associated with at least one of the latch circuits.

A clock generation circuit is coupled to latch circuits and the phase command registers and generates a plurality of internal clock signals and the external data clock signal responsive to a read clock signal. Each internal clock signal and the external clock signal has a respective phase shift relative to the read clock signal. The clock generation circuit selects one of the internal clock signals for each latch circuit in response to the associated phase command and applies the selected internal clock signal to the clock terminal of the latch circuit to place digital signals on the corresponding signal terminal with a timing offset determined by the phase shift of the selected internal clock signal.

A control circuit is coupled to the clock generation circuit and the phase command registers and operates in response to a synchronization command to apply synchronization digital signals on the inputs of the latch circuits and to adjust the respective timing offsets between the external data clock signal and the synchronization digital signals output by each latch circuit by adjusting the respective values of the phase commands. The circuit stores final phase commands in each phase command register that allow the synchronization digital signals to be successfully captured responsive to the external data clock signal. The read synchronization circuit may be utilized in a variety of different types of integrated circuits, including packetized memory devices such as SLDRAMs, nonpacketized devices such as double-data-rate synchronous dynamic random access memories (DDR SDRAMs), and alternative memory architectures having alternative clocking topologies.

DETAILED DESCRIPTION OF THE INVENTION

Figure 5:
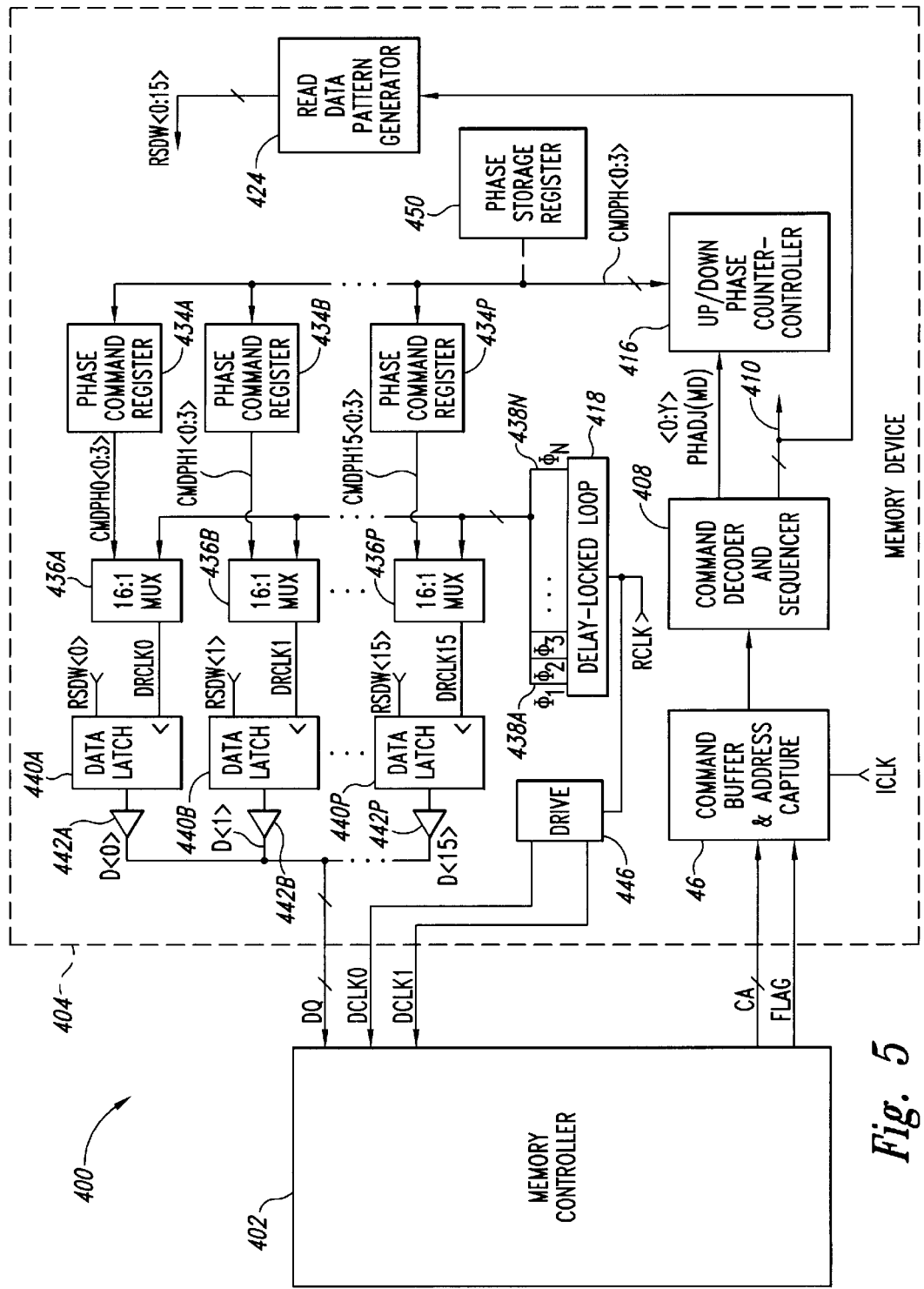
FIG. 5 is block diagram of a read synchronization system for a packetized memory device according to one embodiment of the present invention.

FIG. 5 is a functional block diagram of a read synchronization system 400 including a memory controller 402 and packetized memory device 404 according to one embodiment of the present invention. The memory controller 402 applies command packets CA<0:39> and FLAG bits to the memory device 404 over the command-address bus CA and FLAG line, respectively, and transfers data packet words D<0:15> on the data bus DQ. During read operations, the memory controller 402 clocks the received data packet words D<0:15> into the controller responsive to one of the data clocks DCLK0 and DCLK1. Prior to performing read operations, the memory controller 402 places the memory device 404 in a read synchronization mode of operation and adjusts the timing offset of respective bits DQ<0>–DQ<15> in the data packet words D<0:15> relative to the data clock signals DCLK0 and DCLK1 to synchronize the data clock signals for use during normal read operations, as will be explained in more detail below.

One skilled in the art will understand that synchronization of the data clock signals DCLK0 and DCLK1 as described herein means the adjustment of the timing offset of respective bits D<0>–D<15> in the data packet words D<0:15> relative to the data clock signals DCLK0 and DCLK1 such that the memory controller 402 can successfully capture the data packet words D<0:15> responsive to the data clock signals DCLK0 and DCLK1, as will be discussed in more detail below. In the following description, certain details are set forth to provide a sufficient understanding of the present invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
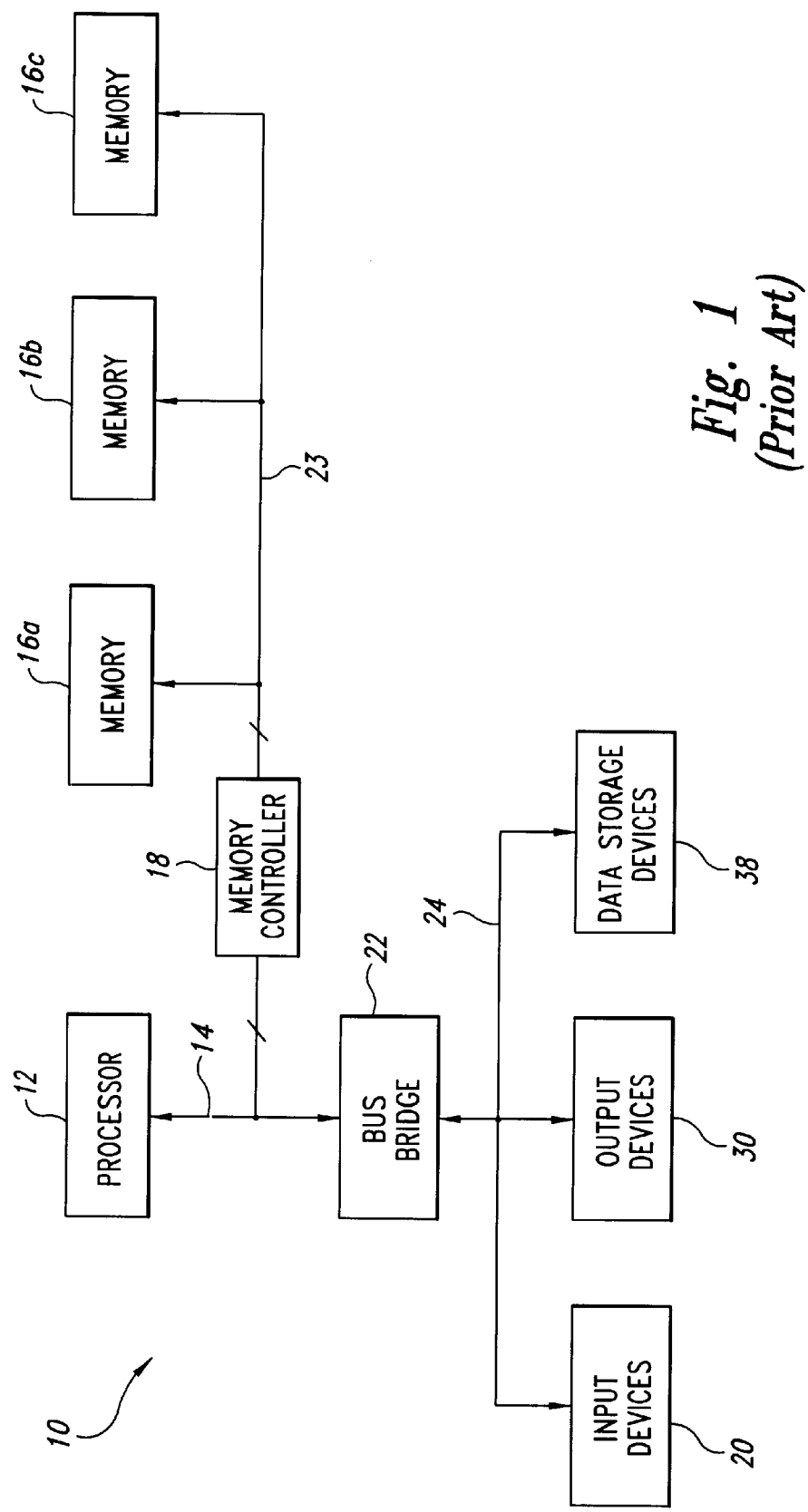
FIG. 1 is a block diagram of a conventional computer system including a plurality of packetized memory devices.
Figure 2:
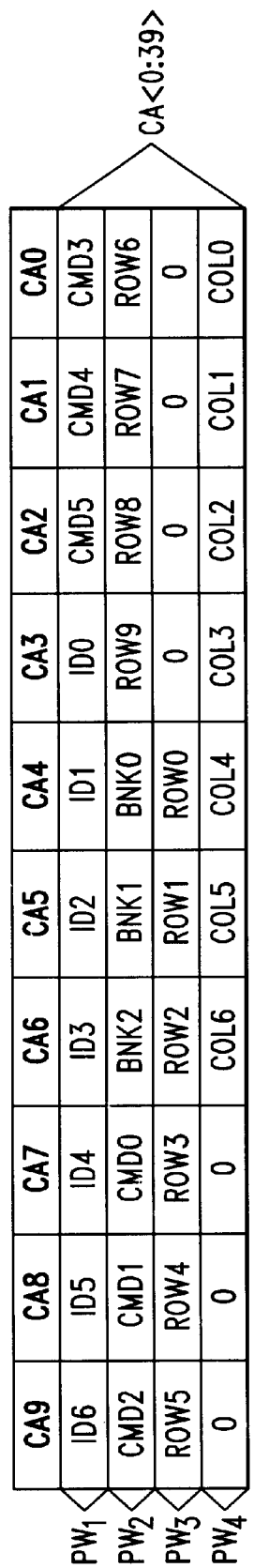
FIG. 2 is diagram showing a typical command packet received by the packetized memory devices of FIG. 1.
Figure 3:
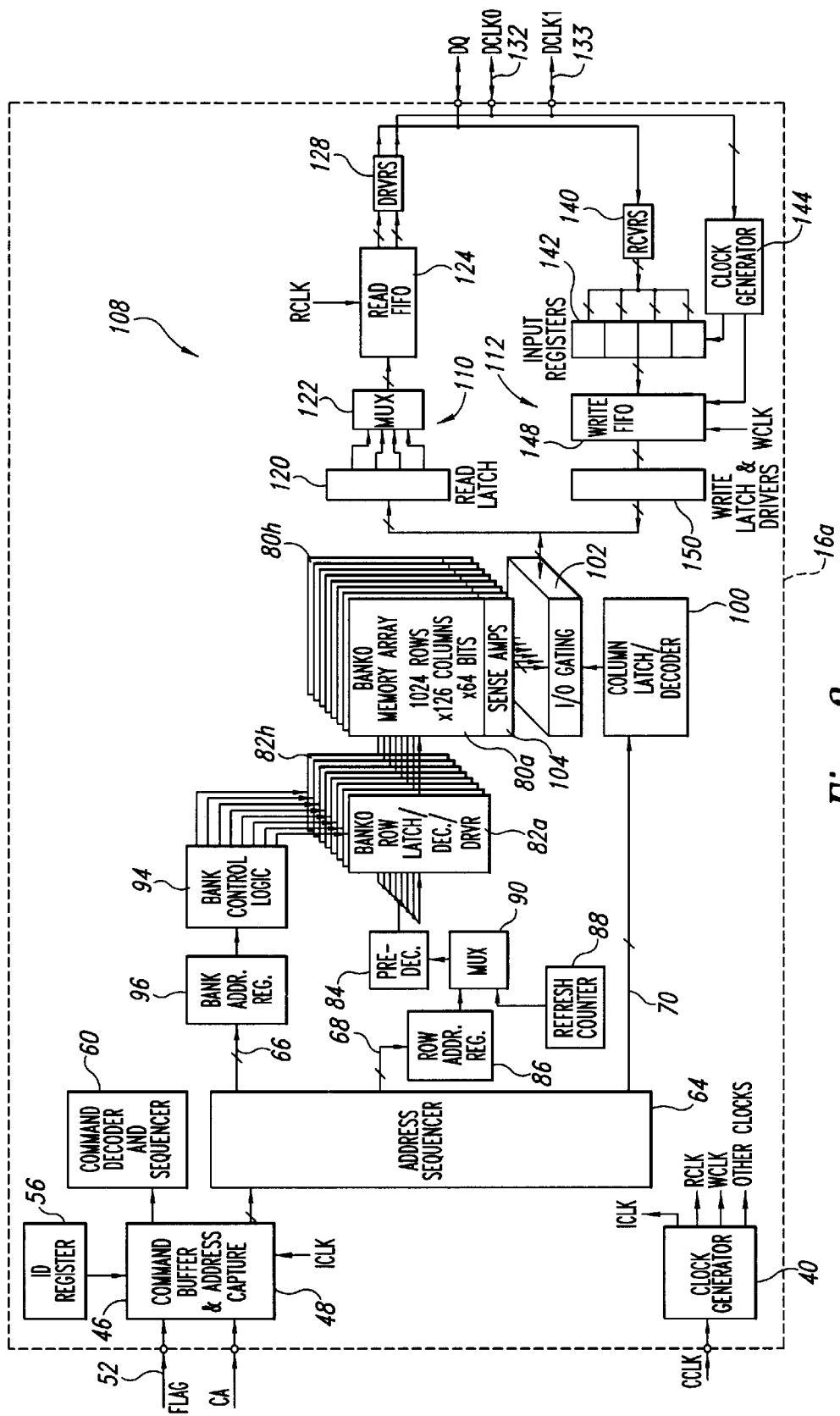
FIG. 3 is a block diagram of a conventional packetized memory device in the computer system of FIG. 1.

In the memory device 404, the command buffer and address capture circuit 46 (FIG. 3) latches packet words CA<0:9> and FLAG bits applied on the respective command-address bus CA and FLAG line as previously described with reference to FIG. 3. A command decoder and sequencer 408 receives the latched command packet CA<0:39> and FLAG bits from the command buffer and address capture circuit 46 and generates a plurality of control signals 410 to control the operation of various components within the memory device 404 in response to the latched command packet CA<0:39> and FLAG signals. During the read synchronization mode of operation, the command decoder and sequencer 408 generates a phase adjust command word PHADJCMD<0:Y> in response to a phase adjustment command that is applied on the command-address bus CA and latched by the command buffer and address capture circuit 46, as will be described in more detail below.

Figure 6:
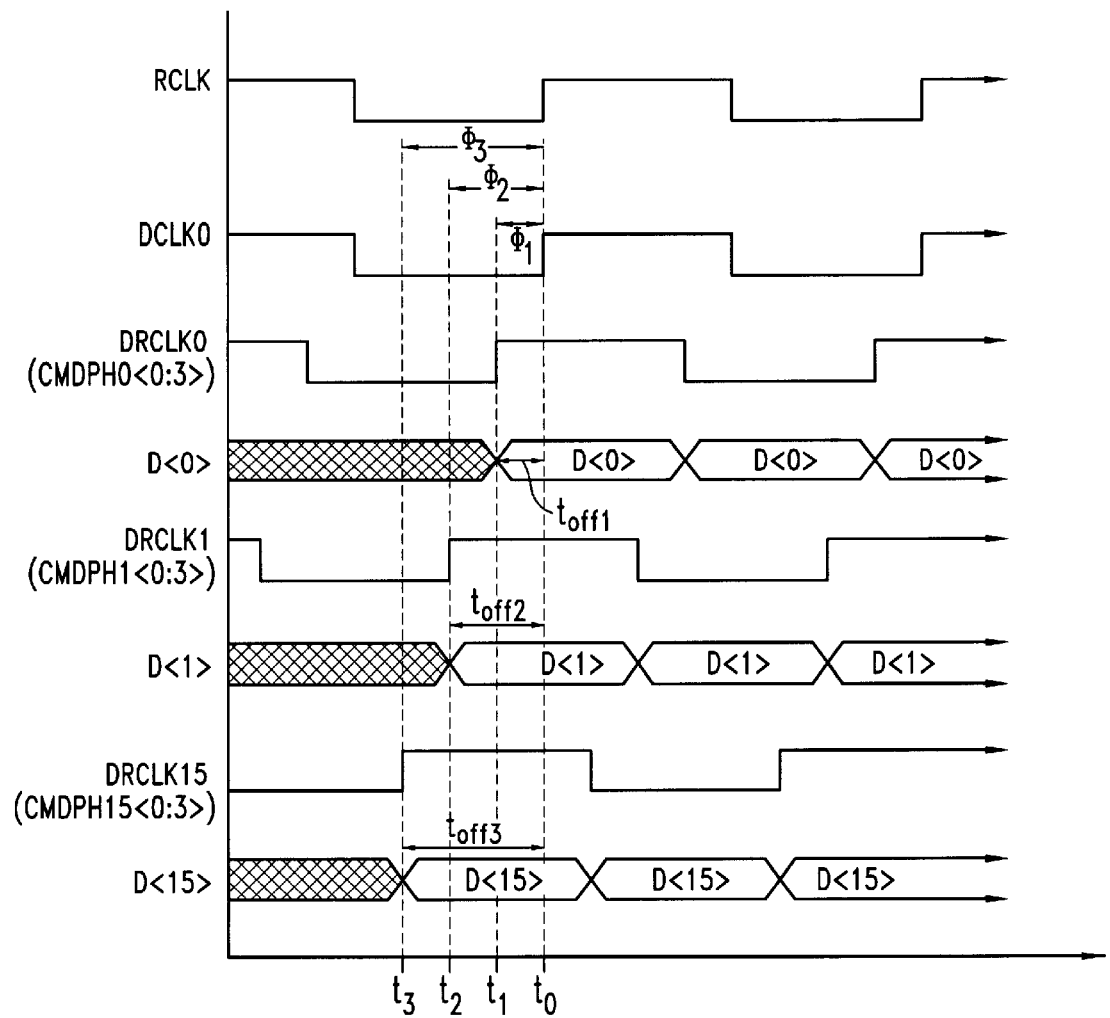
FIG. 6 is a timing diagram illustrating the operation of the system of FIG. 5 in adjusting the respective timing offsets of several data bits relative to a data clock signal to allow the memory controller (FIG. 5) to successfully capture all data bits in response to the data clock signal.

An up/down phase counter-controller 416 latches the phase adjust command word PHADJCMD from the command decoder and sequencer 408 and operates in response to the latched phase adjust command word to develop a phase command word CMDPH<0:3> and to store the developed phase command word in one of a plurality of phase command registers 434A–P, as will be explained in more detail below. The latched CMDPH<0:3> word stored in the registers 434A–P are designated as phase command words CMDPH0<0:3>–CMDPH15<0:3>, respectively. A plurality of multiplexers 436A–P receive the CMDPH0<0:3>–CMDPH15<0:3> words, respectively, stored in the registers 434A–P, and further receive a plurality of clock signals 438A–N from a delay-locked loop circuit 418 on respective inputs. The delay-locked loop circuit 418 develops the plurality of clock signals 438A–N in response to the RCLK signal, with the clock signals 438A–N having phase shifts, designated $\phi_1$-$\phi_N$, respectively, relative to the RCLK signal. In the embodiment of FIG. 6, the delay-locked loop circuit 418 develops sixteen clock signals 434A–N and maintains a phase shift of 180° between the clock signals 438A and 438N. A more detailed description of one embodiment of a programmable-delay clock generation circuit that may be used as the delay locked loop circuit 418 is described in U.S. patent application Ser. No. 08/811,918 to Manning, which is incorporated herein by reference.

Each multiplexer 436A–P provides one of the applied clock signals 438A–N on an output in response to the phase command word CMDPH0<0:3>–CMDPH15<0:3> applied from the corresponding register 434A–P. The clock signals output by the multiplexers 436A–P are designated data read clocks DRCLK0–DRCLK15, respectively, and are applied to clock respective read synchronization data bits RSDW<0>–RSDW<15> into a plurality of data latches 440A–P. A read data pattern generator 424 generates the RSDW<0>–RSDW<15> bits, as will be discussed in more detail below. In response to the applied DRCLK0–DRCLK15 signals, the latches 440A–P store the applied RSDW<0>–RSDW<15> bits, respectively, and apply the stored bits through corresponding buffers 442A–P as the data bits D<0>–D<15> on the data bus DQ. The DRCLK0–DRCLK15 signals thus determine when each latch 440A–P places the corresponding RSDW<0>–RSDW<15> bit onto the corresponding line of the data bus DQ relative to transitions of the RCLK signal. This is true because each DRCLK0–DRCLK15 signal corresponds to one of the clock signals 438A–N selected by the corresponding multiplexer 436A–P responsive to the applied CMPDH0<0:3>–CMDPH15<0:3> word, and each clock signal 438A–N has a defined phase shift relative to the RCLK signal as previously described. The memory device 404 further includes a data clock driver circuit 446 that generates the data clock signals DCLK0 and DCLK1 in response to the read clock signal RCLK. Although the two data clocks DCLK0, DCLK1 are discussed in the described embodiments, only one data clock may be used in an alternative embodiment as will be understood by those skilled in the art.

During the read synchronization mode of operation, the read data pattern generator 424 generates successive 16-bit read synchronization data packet words RSDW<0:15>, with respective bits RSDW<0>–RSDW<15> in each word being clocked into respective data latches 440A–P in response the DCLK0–DCLK15 signals. During normal read operations, the 16-bit data packet words D<0:15> corresponding to the data being accessed are successively output from the multiplexer 122 (FIG. 3) and are clocked into the data latches 440A–P responsive to the DCLK0–DCLK15 signals and thereafter applied through the buffers 442A–P and onto the data bus DQ. For ease of explanation and clarity of description, FIG. 5 illustrates only the read data pattern generator 424 and corresponding RSDW<0:15> words being applied to the latches 440A–P. The driver circuit 446 outputs the DCLK0, DCLK1 signals along with the RSDW<0:15> words being successively placed on the data bus DQ during the read synchronization mode and outputs the selected one of the DCLK0, DCLK1 signals along with the 16-bit data packet words being successively placed on the data bus DQ during the normal read mode. The read data pattern generator 424 may generate a variety of data patterns, and in one embodiment the read data pattern generator 424 generates a 15-bit repeating pseudo-random bit sequence as described in U.S. patent application Ser. No. 09/143,033 entitled METHOD AND APPARATUS FOR RESYNCHRONIZING A PLURALITY OF CLOCK SIGNALS USED TO LATCH RESPECTIVE DIGITAL SIGNALS, AND MEMORY DEVICE USING SAME, to Manning, which is incorporated herein by reference.

During the read synchronization mode of operation, the memory controller 402 sequentially latches data words D<0:15> applied on the data bus DQ by the memory device 404 in response to the selected DCLK0, DCLK1 signal. For each bit in the latched D<0:15> words, the memory controller 402 executes a synchronization process to determine whether the latched bit D<0>–D<15> was successfully captured in response to the selected one of the DCLK0, DCLK1 signals. For example, the controller can generate an expected value for the bit D<0>–D<15> and compare the latched bit to the expected value. When the two bits are equal, the controller 402 determines the bit was successfully captured, and otherwise determines the capture was unsuccessful. The controller 402 then sends a phase adjustment command to the memory device 404 over the CA bus. In response to the phase adjustment command, the device 404 adjusts the timing offset between the selected DCLK0, DCLK1 signal and the bit D<0:15> being synchronized, and thereafter once again determines whether the bit is successfully captured.

The overall operation of the read synchronization system 400 in synchronizing the data clock signals DCLK0 and DCLK1 during the read synchronization mode of operation will now be described in more detail. The memory controller 402 operates in the read synchronization mode in response to a predetermined condition. For example, the memory controller 402 may operate in the read synchronization mode of operation as part of an initialization and synchronization procedure during which the memory controller 402 also synchronizes the command clock signal CCLK and the data clock signals DCLK0 and DCLK1 during write operations, and further performs other functions in initializing the memory device 404. Alternatively, the memory controller 402 may operate in the read synchronization mode of operation after a predetermined time during normal operation of the memory controller and memory device 404 in order to periodically resynchronize the data clock signals DCLK0 and DCLK1.

After commencing operation in the read synchronization mode of operation, the memory controller 402 applies phase adjustment commands to the memory device 404. Each phase adjustment command includes information identifying a particular memory device 404 and a particular bit D<0>–D<15> that is to be synchronized. contains information that is utilized by the memory device 404 to adjust the value of the phase command word CMDPH<0:3> stored in a corresponding phase command register 434A–P, as will be explained in more detail below. The phase adjustment command also selects one of the DCLK0, DCLK1 signals with which each D<0>–D<15> bit is to be synchronized. As previously mentioned, the value of the CMDPH<0:3> word adjusts the timing offset between the corresponding bit D<0>–D<15> and transitions of the selected data clock signal DCLK0 and DCLK1, and in this way the memory controller 402 utilizes the phase adjustment commands to adjust this offset for each bit D<0>–D<15>.

The command buffer and address capture circuit 46 latches the applied phase adjustment commands read in response to the ICLK signal as previously described with reference to FIG. 3, and outputs the latched command to the command decoder and sequencer 408. The command decoder and sequencer 408 decodes the command portion of the applied phase adjustment command and thereafter generates the control signals 410 to place the memory device 404 in the read synchronization mode of operation. As part of placing the memory device 404 in the read synchronization mode, the up/down phase counter-controller 416 stores initial values for the CMDPH0–CMDPH15<0:15> words in the phase command registers 434A–P, and the read data pattern generator 424 begins sequentially applying the read synchronization data words RSDW<0:15> to the data latches 440A–P. The command decoder and sequencer 408 also generates the phase adjustment command word PHADJCMD<0:Y> in response to the applied phase adjustment command from the controller 402. The value of the generated phase adjustment command word PHADJCMD<0:Y> is determined by the value of the phase adjustment command, and in this way the memory controller 402 controls the value of the phase adjustment command word PHADJCMD<0:Y>. As previously mentioned, the PHADJ<0:N> word contains information identifying a "selected" bit, which corresponds to the bit D<0>–D<15> on the data bus DQ that is being synchronized, and the PHADJCMD<0:Y> word similarly contains information identifying the selected bit.

The developed PHADJCMD<0:Y> word is applied to the counter-controller 416, which first examines the latched PHADJCMD<0:Y> word to determine the selected bit and thereafter reads the current value of the phase command word CMDPH<0:3> stored in the phase command register 434A–P associated with the selected bit. For example, if the PHADJCMD<0:Y> word identifies the bit D<0>, the counter-controller 416 reads the value of the CMDPH0<0:3> word stored in the phase command register 434A. After reading the value of CMDPH<0:3> word stored in the selected phase command register 434A–P, the counter-controller 416 generates a new value for the CMDPH<0:3> word responsive to the PHADJCMD<0:Y>. For example, the PHADJCMD<0:Y> word may contain information instructing the counter-controller 416 to increment or decrement the value of the read CMDPH<0:3> word. Once the counter-controller 416 has generated the new CMDPH<0:3> word, the counter-controller 416 stores the new word in the appropriate phase command register 434A–P. For example, if bit D<0> is being synchronized, the counter-controller 416 stores the newly generated value for the CMDPH0<0:3> word in the register 434A.

The counter-controller 416 can, alternatively, simply store an updated phase command word CMDPH<0:3> in the appropriate register 434A–P responsive to the PHADJCMD<0:Y> word. In this way, the counter-controller 416 need not first read the CMDPH<0:3> word stored in the register 413A–P being updated. In another embodiment of the system 400, the counter-controller 416 can simultaneously adjust the values of the CMDPH0<0:3>–CMDPH15<0:3> words stored in the registers 434A–P, respectively. In this embodiment, the PHADJCMD<0:Y> word includes information the counter-controller 416 uses in independently adjusting each of the CMDPH0<0:3>–CMDPH15<0:3> words.

At this point, the read synchronization data words RSDW<0:15> generated by the pattern generator 424 are clocked into the data latches 440A–P responsive to the clock signals DRCLK0–DRCLK15, respectively, with each of these clock signals having an offset relative to the RCLK signal. As previously described, each multiplexer 436A–P outputs a selected one of the clock signals 438A–N as the corresponding DRCLK0–DRCLK15 signal, with the selected clock signal being determined by the value of the CMDPH0–CMDPH15<0:3> word applied to the multiplexer from the corresponding phase command register 434A–P. Thus, the data bits RSDW<0>-RSDW<15> are clocked out of the data latches 440A–P having respective timing offsets relative to the RCLK signal and thus relative to the DCLK0, DCLK1 signals, with each timing offset being determined by the value of the CMDPH0–CMDPH15<0:3> word store in the corresponding phase command register 434A–P.

At this point, in the memory controller 402 latches applied D<0:15> words responsive to the selected DCLK0, DCLK1 signal, and then determines whether the bit D<0>–D<15> being synchronized in the latched word was successfully captured. The memory controller 402 compares the latched value of the bit D<0>–D<15> being synchronized applied data word D<0:63> to the expected value for the bit and stores the result of the comparison. The Memory controller 402 thereafter generates a second phase adjustment command including an incremented phase value, and applies this new command to the memory device 404. The command buffer and address capture circuit 46 once again latches the applied phase adjustment command and outputs the latched command to the command decoder and sequencer 408. In response to the incremented phase value in this new phase adjustment command, the command decoder and sequencer 408 applies a new PHADJCMD<0:Y> word to the counter-controller 416 which, in turn, reads the current value of the selected CMDPH0<0:3>–CMDPH15<0:3> word and increments or decrements the current value to develop a new CMDPH0<0:3>–CMDPH<15> word. The counter-controller 416 then stores the new value of the CMDPH0<0:3>–CMDPH<15> word in the corresponding register 434A–P. At this point, the RSDW<0>–RSDW<15> bits from the pattern generator 424 are clocked into the data latches 440A–P responsive to the clock signals DRCLK0–DRCLK15, respectively, with each of these clock signals having an offset relative to the DCLK0, DCLK1 signals as determined the current values of the CMDPH0<0:3>–CMDPH15<0:3> words. The RSDW<0:15> words are thus clocked out of the data latches 440A–P as the data initialization packet words D<0:15> on the data bus DQ, each bit D<0>–D<15> having a timing offset relative to the selected DCLK0, DCLK1 signal with the selected bit D<0>–D<15> currently being synchronized having a new timing offset as determined by the new value of the corresponding CMDPH0<0:3>-CMDPH<0:3> word.

The memory controller 402 once again captures from the data bus DQ the data initialization packet words D<0:15> having the new timing offset applied to the bit D<0>–D<15> being synchronized, compares the latched value to an expected value, and stores the result of this comparison. The memory controller 402 continues adjusting the value of the phase adjustment command and applying the adjusted commands to the memory device 404 in order to adjust the timing offset between the selected D<0>–D<15> bit and the selected data clock signal DCLK0, DCLK1. As the memory controller 402 adjusts the values of the phase adjustment commands, the memory controller stores a number of comparison results, each comparison result value corresponding to a particular value of the phase adjustment command (i.e., a particular timing offset of the selected bit D<0>–D<15> relative to the selected DCLK0 and DCLK1 signal). After a predetermined number of comparison results have been stored, the memory controller 402 executes a phase selection procedure to select a final phase adjustment command from among the phase adjustment commands that resulted in the successful capture of the selected bit D<0>–D<15> as indicated by the corresponding comparison result. In one embodiment, the memory controller 402 stores sixteen comparison results, each corresponding to one of sixteen values for the phase adjustment command, and selects the final phase adjustment command from among the ones of the sixteen values that resulted in the successful capture of the selected D<0>–D<15> bit. One procedure that may be executed by the control circuit 406 in determining the final phase adjustment word PHADJ<0:4> is described in more detail in U.S. Pat. No. 5,953,284 to Baker et al., entitled METHOD AND APPARATUS FOR ADAPTIVELY ADJUSTING THE TIMING OF A CLOCK SIGNAL USED TO LATCH DIGITAL SIGNALS, AND MEMORY DEVICE USING SAME, which issued Sep. 14, 1999 and which is incorporated herein by reference.

After selecting the desired one of the phase adjustment commands, the memory controller 402 applies the selected phase adjustment command to the memory device 404. The command buffer and address capture circuit 46 and command decoder and sequencer 408 in the memory device 404 then operate as previously described develop the selected PHADJCMD<0:Y> word corresponding to the selected phase adjustment command. The counter-controller 416 receives the selected PHADJCMD<0:Y> word, which includes information indicating that the word corresponds to the final selected value for the corresponding bit D<0>–D<15>. In response to the selected PHADJCMD<0:Y> word, the counter-controller 416 operates as previously described to update the value of the CMDPH0<0:3>-CMDPH<0:3> word stored in the register 434A–P corresponding to the bit being synchronized to a final value as determined by the selected PHADJCMD<0:Y> word. For example, if the D<0> bit is being synchronized, the counter-controller 416 sets the value of the CMDPH0<0:3> word stored in the register 434A to a final value as determined by the selected PHADJCMD<0:Y> word.

Upon the final phase command word CMDPH0<0:3>–CMDPH15<0:3> being stored in the corresponding register 434A–P, the corresponding clock signal DRCLK0–DRCLK15 signal has a phase relative to the read clock signal RCLK that is determined by the final phase command word, and this phase is utilized during normal read operations of the memory device 404. This final phase command word CMDPH0<0:3>–CMDPH15<0:3> defines the timing offset between the selected DCLK0, DCLK1 signal and the corresponding bit D<0>–D<15>. This timing offset is then used during normal read operations of the memory device 404 so that the memory controller 402 may successfully capture this bit in the data packet words D<0:15> being transferred to the memory controller in response to read commands from the controller. The memory controller 402 control circuit 406 thereafter develops a data clock offset to edge align the second DCLK0, DCLK1 signal with the selected data clock signal. That enables the controller 402 to successfully capture data bits D<0>–D<15> responsive to either DCLK0, DCLK1 signal.

After synchronizing both DCLK0, DCLK1 signals for the selected bit D<0>–D<15>, the memory controller 402 develops a new phase adjustment command identifying the next bit D<0>–D<15> to be synchronized, and the memory controller 402 and memory device 404 thereafter operate in the same way as just described to synchronize the newly selected bit. The controller 402 and memory device 404 repeat this process for each of the bits D<0>–D<15> to independently synchronize each bit with the DCLK0, DCLK1 signals. When each bit D<0>–D<15> has been synchronized, the phase command registers 434A–P store final phase command values CMDPH0<0:3>–CMDPH15<0:3> to define the respective timing offsets between the each bit D<0>–D<15> and the DCLK0, DCLK1 signals. As will be understood by those skilled in the art, the exact process executed in synchronizing each D<0>–D<15> bit may be varied. For example each bit D<0>–D<15> may first be synchronized with the DCLK0 signal, and then each synchronized with the DCLK1 signal. Alternatively, a selected D<0>–D<15> bit may be synchronized with the DCLK0 signal, then the next selected bit synchronized with the DCLK0, signal, and so on sequentially for all bits. In another process, respective D<0>–D<15> bits may be independently synchronized with the DCLK0, signal in parallel. Other processes and combinations of the described processes may be utilized and will be well understood by those skilled in the art.

In another embodiment of the synchronization system 400 of FIG. 5, the memory device 404 includes a shadow register 450, which is indicated with dotted lines, coupled between the counter-controller 416 and the phase command registers 434A–P. The shadow register 450 stores all the current CMDPH0–15<0:3> words, and functions as a storage "pipeline" between the counter-controller 416 and the registers 434A–P. In the system 400, the phase command registers 434A–P will typically be located near the data latches 440A–P and buffers 442A–P, which will all be physically proximate the external data bus DQ terminals of the memory device 404. In contrast, the counter-controller 416 may not be located physically near the registers 434A–P, thus causing the transfer of CMDPH0–15<0:3> words between the registers and the counter-controller to be slowed down due to the physical lengths of the data lines interconnecting these two components, as will be appreciated by those skilled in the art. If the counter-controller 416 must wait until an updated CMDPH0–15<0:3> word has been stored in the corresponding register 434A–P, the operation of the system 400 may be slowed down due to the delay in transferring the words between the counter-controller and the registers. With the shadow register 450, the counter-controller 416 can quickly update the value of one of the CMDPH0–15<0:3> words responsive to a corresponding phase adjustment command word PHADJCMD<0:Y> and thereafter begin processing a subsequent PHADJCMD<0:Y> word. The shadow register 450 thereafter transfers the updated CMDPH0–15<0:3> word to the proper register 434A–P while the counter-controller 416 is processing the subsequent command word PHADJCMD<0:Y>.

FIG. 6 is a signal timing diagram that will be utilized to illustrate the relationship between the phase shift of the DRCLK0–DRCLK15 signals relative to the RCLK signal as defined by the respective CMDPH0<0:3>-CMDPH<15> words, and also illustrates the corresponding timing offset between the DCLK0 signal and respective bits D<0>–D<15> applied on the data bus DQ. In the example of FIG. 5, the DCLK0 signal, which is generated by the drivers 446 in response to the RCLK signal, has the same phase as the RCLK signal. FIG. 5 illustrates the three different delayed read clock signals DRCLK0, DRCLK1, and DRCLK15 corresponding to values CMDPH0<0:3>, CMDPH1<0:3>, and CMDPH15<0:3> of the phase command word stored in the registers 434A, 434B, and 434P, respectively. As shown, the DRCLK0 signal has a phase shift $\phi_1$ relative to the DCLK0 signal. When the DRCLK0 signal goes high at a time $t_1$, the corresponding data bit D<0> is placed on the data bus DQ have a timing offset $t_{off1}$ relative to the rising edge of DCLK0 signal at a time $t_0$. As previously discussed, the data bit D<0> is offset by the time $t_{off1}$ to enable the memory controller 402 to successfully latch the data bit in response to the DCLK0 signal.

In the second example of FIG. 5, the DRCLK1 signal corresponding to the CMDPH1<0:3> word has a phase shift $\phi_2$ relative to the DCLK0 signal, and the corresponding data bit D<1> has a timing offset $t_{off2}$ relative to the rising edge of the DCLK0 signal at the time to. Thus, in this example the data bit D<1>is applied on the data bus DQ at a time $t_2$ before the rising edge of the DCLK0 signal at the time to. The third example illustrates the DRCLK15 signal having a phase shift $\phi_3$ relative to the DCLK0 signal, and the corresponding data D<15> has a timing offset $t_{off3}$ relative to the rising edge of the DCLK0 signal at the time to. In this example, the data D<15> is applied on the data bus DQ at a time $t_3$ before the rising edge of the DCLK0 signal at the time to. As illustrated by these examples, the phase command words CMDPH0<0:3>, CMDPH1<0:3>, and CMDPH15<0:3> are independently adjusted to thereby vary the phase shift of the DRCLK0–DRCLK15 signals relative to the DCLK0 signal. As the respective phase shifts of the DRCLK0–DRCLK15 signals are adjusted relative to the DCLK0 signal, the timing offsets of the respective data bits D<0>–D<15> in each data packet D<0:15> applied on the data bus DQ are adjusted relative to transitions of the DCLK0 signal by an amount corresponding to the adjusted phase shifts.

One skilled in the art will realize that the procedure executed by the control circuit 406 in synchronizing the data clock signals DCLK0, DCLK1 may vary. For example, in the above-described procedure the control circuit 406 captures only one data packet D<0:63> at each phase of the DRCLK0–DRCLK15 signal corresponding to the bit D<0>–D<15> being synchronized. In another embodiment, the control circuit 406 may perform a predetermined number of comparisons at each given phase of the DRCLK0–DRCLK15 signal and timing offset of the corresponding D<0>–D<15> bit relative to the data clocks DCLK0 and DCLK1. In this embodiment, the control circuit 406 may, for example, control components of the memory controller 402 so that eight data packets D<0:63> are captured and compared at each phase of the DRCLK0–DRCLK15 signals. When all eight of these comparisons indicate successful captures, the control circuit 406 stores a "1" indicating successful data capture at this phase. However, if any of the comparisons at a given phase indicates an unsuccessful capture, the control circuit 406 stores a "0" indicating failure at this phase. Once again, after sixteen, for example, results signals have been stored, the control circuit 406 determines the final phase adjustment word PHADJ<0:4> and transfers this word to the memory device 404. The memory device 404 then operates as previously described, applying the corresponding PHADJCMD<0:Y> word to the counter-controller 416 which, in turn, stores the final phase command word CMDPH0<0:3>-CMDPH15<0:3> in the appropriate phase command register 434A–P to thereby set the final phase of the corresponding DRCLK0–DRCLK15 signal being adjusted.

Figure 4:
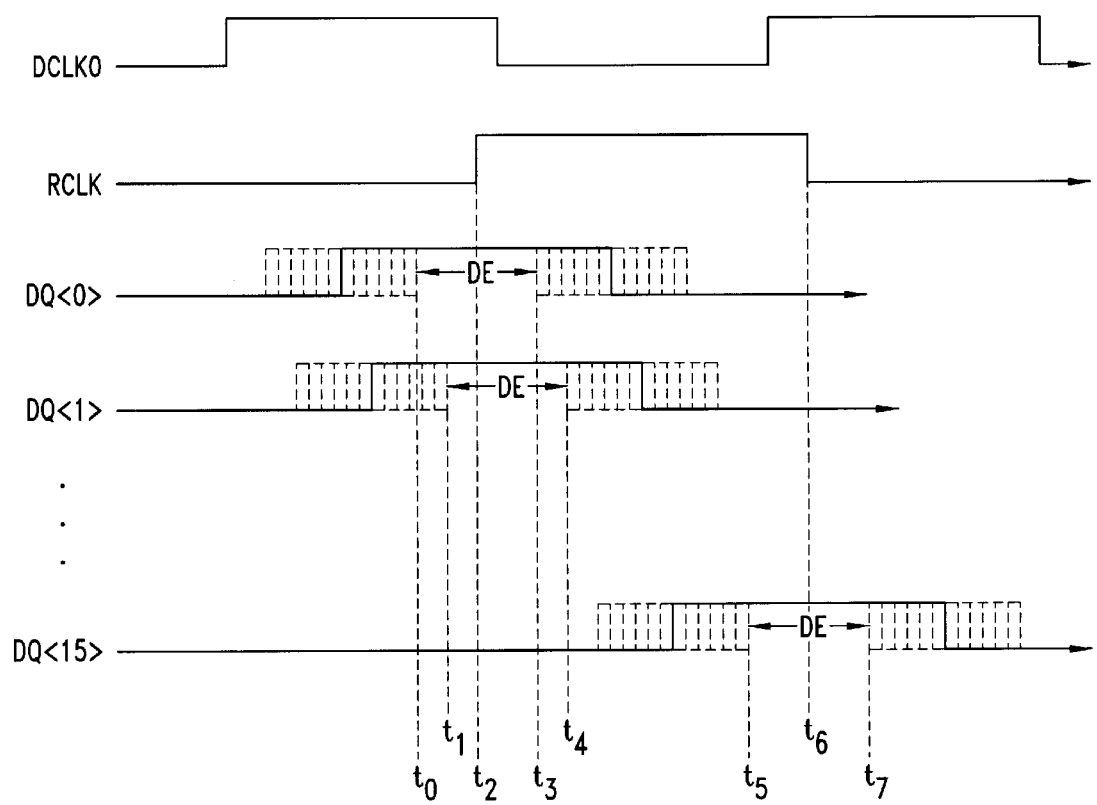
FIG. 4 is a timing diagram illustrating the effect of timing skews on capturing respective data signals on the data bus at high data transfer rates.

The overall operation of the read synchronization system 400 and general operation of several components within that circuit have now been described with reference to FIG. 4. More detailed circuitry for implementing the components of the read synchronization system 400 contained within the memory controller 402 and memory device 404 will be understood by those skilled in the art, and are not provided in more detail to avoid unnecessarily obscuring the present invention. Several of these components are described in more detail in U.S. Pat. No. 6,029,250 to Keeth entitled METHOD AND APPARATUS FOR ADAPTIVELY ADJUSTING THE TIMING OFFSET BETWEEN A CLOCK SIGNAL AND DIGITAL SIGNALS TRANSMITTED COINCIDENT WITH THAT CLOCK SIGNAL, AND MEMORY DEVICE AND SYSTEM USING SAME, which is incorporated herein by reference. In addition, in addition to being used with a programmable delay circuit, such as the delay-locked loop 418, the present invention may be used with other circuits for adjusting the timing offset between electrical signals, such as the command delay rings 506a described in U.S. patent application. Ser. No. 09/201,519 to Keeth, entitled METHOD AND APPARATUS FOR HIGH SPEED DATA CAPTURE UTILIZING BIT-TO-BIT TIMING CORRECTION, AND MEMORY DEVICE USING SAME, which was filed on Nov. 30, 1998 and which is incorporated herein by reference. Furthermore, as previously mentioned, the synchronization system 400 may be used in a variety of different types of memory devices in addition to the SLDRAM devices described herein, such as in RAMBUS type memory devices and in double-data-rate synchronous dynamic random access memory devices ("DDR SDRAMs"). In DDR SDRAMs, the timing offsets of respective bits on the data bus DQ are adjusted with respect to a data strobe signal DQS, as will be appreciated by those skilled in the art.

Figure 7:
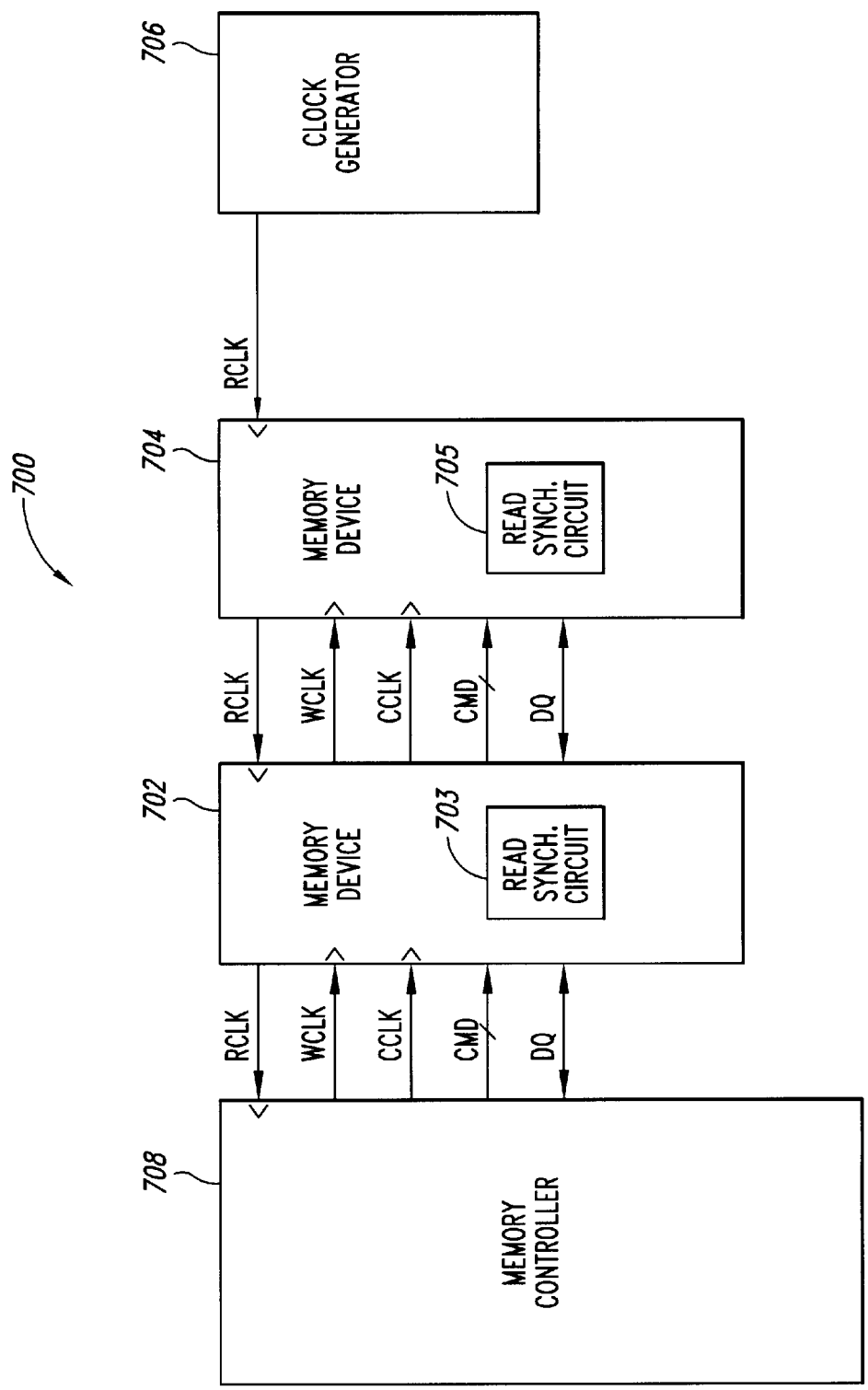
FIG. 7 is a functional block diagram illustrating a memory system including components of the read synchronization system of FIG. 5 according to another embodiment of the present invention.

FIG. 7 is a functional block diagram illustrating a memory system 700 including memory devices 702, 704 that include read synchronization circuits 703, 705 according to another embodiment of the present invention. Each of the read synchronization circuits 703, 705 includes components (not shown) of the read synchronization system 400 of FIG. 5, as will be discussed in more detail below. In the memory system 700, a clock generator 706 generates a system read clock signal RCLK that is applied to the memory devices 702, 704 and is applied to a memory controller 708. During a read operations, the memory device 702, 704 being accessed supplies read data on a data bus DQ and the memory controller 708 latches the read data in response to the RCLK signal. During write operations, the memory controller 708 supplies write data on the data bus DQ and applies a write clock signal WCLK to the memory devices 702, 704 which, in turn, latch the write data in response to the write clock signal. The memory controller 708 applies command and address information to the memory devices 702, 704 over a command bus CMD and also applies a command clock signal CCLK that the memory devices utilize to latch the applied command and address information. One skilled in the art will appreciate that the command bus CMD may be a multiplexed bus including both command and address information when the memory devices 702, 704 are packetized type memory devices such as SLDRAMs. Alternatively, the command bus CMD may include separate command and address busses when the memory devices 702, 704 are non packetized type memory devices such as a DDR SDRAM.

During normal write operations, the memory controller 708 applies a write command on the CMD bus to the memory devices 702, 704 which, in turn, latch the write command in response to the CCLK signal also applied by the memory controller. Each of the memory devices 702, 704 decodes the latched command and determines whether it is the device being accessed. The memory controller 708 supplies write data on the DQ bus and the memory device 702, 704 being accessed latches the supplied write data in response to the CCLK signal from the memory controller. During normal read operations, the memory controller 708 applies the read command on the CMD bus to the memory devices 702, 704 which, once again, latch and decode the read command. The memory device 702, 704 being accessed thereafter supplies read data on the DQ bus and the memory controller 708 latches the read data in response to the RCLK the signal from the clock generator 706. Each of the data bits on the DQ bus has a respective timing offset relative to the RCLK signal, with the timing offsets being determined during a read synchronization mode of operation. The respective timing offsets allow the memory controller 708 to successfully capture all read data bits supplied on the DQ bus during normal read operations. During the read synchronization mode of operation, the circuits 703, 705 operate in an analogous manner to components of the read synchronization system 400 of FIG. 5. Such operation will be well understood by those skilled in the art in view of the previous detailed description of the read synchronization system 400 of FIG. 5, and thus, for the sake of brevity, will not be described in more detail. Briefly, for each data bit on the data bus DQ a phase command CMDPH is stored in corresponding phase command register 434A–434P (see FIG. 5) to define the timing offset between the data bit and the RCLK signal.

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A method of transferring digital signal packets out of a packetized memory device on a data bus, each digital signal packet including at least one packet word including a plurality of digital signals that are applied to respective latches in the packetized memory device, the method comprising:

placing the packetized memory device in a synchronization mode of operation;

generating a data clock signal responsive to a read clock signal and applying the data clock signal on a corresponding line of the data bus;

generating a plurality of internal clock signals responsive to the read clock signal, each internal clock signal having a phase shift relative to the data clock signal;

storing for each digital signal a phase command in a corresponding storage circuit associated with the digital signal, the phase command having a value corresponding to one of the internal clock signals;

placing each digital signal on a corresponding data bus line responsive to the internal clock signal corresponding to the phase command stored in the associated storage circuit;

receiving a phase adjustment command corresponding to a particular digital signal that is being synchronized, the phase adjustment command containing adjustment information for the phase command associated with the digital signal;

adjusting the value of the phase command stored in the storage circuit associated with the digital signal being synchronized responsive to the phase adjustment command until the value of the phase command defines a timing offset between the digital signal and the data clock that allows an external device to successfully capture the digital signal responsive to the data clock signal; and repeating the operations of placing each digital signal on a corresponding bus line to adjusting the value of the phase command signal for each digital signal in the packet word.

2. The method of claim 1 wherein the values of the phase commands for all the digital signals are adjusted in parallel.

3. The method of claim 1 wherein adjusting the value of the phase command stored in the storage circuit comprises reading an initial value of the phase command from the storage circuit, incrementing or decrementing the values of the initial phase command response to the phase or adjustment command, to generate a new phase command, and storing the new phase command in the storage circuit.

4. The method of claim 1 wherein each storage circuit comprises a register.

5. The method of claim 1 wherein placing the packetized memory device in the synchronization mode comprises capturing a FLAG signal and generating a calibration signal when the FLAG signal has a predetermined binary value for two consecutive captures.

6. The method of claim 1 wherein adjusting the value of the phase command stored in the storage circuit associated with the digital signal being synchronized comprises:

repetitively placing digital signals having expected values onto the corresponding data bus line;

evaluating the digital signal captured responsive to the data clock signal to determine if captured digital signal has the expected value;

identifying each phase command that caused the associated digital signal having the expected value to be captured;

selecting a phase command for each digital signal from one of the phases that caused the associated digital signal having the expected value to be captured; and storing the selected phase command in the corresponding register.

7. The method of claim 6 wherein the operations of evaluating the captured digital signal to determine if the stored digital signal has the expected value through storing the selected phase command in the corresponding register are performed sequentially on each of the digital signals to sequentially select a phase command associated with each digital signal.

8. The method of claim 6 wherein evaluating the captured digital signal to determine if the digital signal has the expected value comprises:

capturing the digital signal responsive to the data clock signal;

generating expected values for the digital signal responsive to the values of the captured digital signal; and determining that the digital signal was successfully captured when the values of the captured digital signal corresponds to the generated expected values for the digital signal.

9. A method of adaptively adjusting respective timing offsets of a plurality of digital signals relative to a clock signal being output along with the digital signals to enable a circuit receiving the digital signals successfully to each of the digital signals responsive to the clock signal, the method comprising:

storing in a respective storage circuit associated with each digital signal a corresponding phase command, the phase command defining a particular timing offset between the corresponding digital signal and the clock signal;

outputting the clock signal;

outputting each digital signal having the timing offset defined by the corresponding phase command;

capturing the digital signals responsive to the clock signal;

evaluating the captured digital signals to determine if each digital signal was successfully captured;

generating a phase adjustment command to adjust the value of each phase command;

repeating the operations of outputting the clock signal through generating a phase adjustment command for a plurality of phase adjustment commands for each digital signal;

selecting for each digital signal a phase command that causes the digital signal to be successfully captured; and storing in the storage circuit associated with each digital signal the corresponding selected phase command.

10. The method of claim 9 wherein the operations of outputting a clock signal through generating a phase adjustment command are performed in parallel on all the digital signals.

11. The method of claim 9 wherein generating a phase adjustment command to adjust the value of each phase command comprises reading an initial value of the phase command from the storage circuit, incrementing or decrementing the values of the initial phase command in response to the phase adjustment command, to generate a new phase command, and storing the new phase command in the storage circuit.

12. The method of claim 9 wherein each storage circuit comprises a register.

13. The method of claim 9 wherein the clock signal corresponds to a data clock signal output from a packetized memory device and each digital signal corresponds to a data signal applied on a data bus of the packetized memory device.

14. The method of claim 12 wherein outputting each digital signal having the timing offset defined by the corresponding phase command comprises outputting a repeating 15 bit pseudo-random bit sequence of "111101011001000" for each digital signal, with the timing offset of this sequence being defined by the phase command.

15. The method of claim 12 wherein capturing the digital signals responsive to the clock signal comprises capturing the digital signals responsive to the rising and falling edges of the clock signal.

16. A read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:
 a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;
 a plurality of phase command registers, each phase command register storing a phase command and each register being associated with at least one of the latch circuits;
 a clock generation circuit coupled to latch circuits and the phase command registers, the clock generation circuit generating a plurality of internal clock signals and the external data clock signal responsive to a read clock signal, each internal clock signal and the external clock signal having a respective phase shift relative to the read clock signal, and the clock generation circuit selecting one of the internal clock signals for each latch circuit in response to the associated phase command and applying the selected internal clock signal to the clock terminal of the latch circuit to place digital signals on the corresponding signal terminal with a timing offset determined by the phase shift of the selected internal clock signal; and
 a control circuit coupled to the clock generation circuit and the phase command registers, the control circuit operable in response to a synchronization command to apply synchronization digital signals on the inputs of the latch circuits and to adjust the respective timing offsets between the external data clock signal and the synchronization digital signals output by each latch circuit by adjusting the respective values of the phase commands, and storing final phase commands in each phase command register that allow the synchronization digital signals to be successfully captured responsive to the external data clock signal.

17. The read synchronization circuit of claim 16 wherein the control circuit comprises:
 a read data pattern generator that generates the synchronization digital signals, each signal being a repeating pseudo-random bit sequence;
 a command buffer and address capture circuit adapted to latch and output command-address signals applied on a command address bus;
 a command decoder and sequencer coupled to the output of the command buffer and address capture circuit that generates a plurality of control signals responsive to the latched command-address signals, and generates a phase adjustment command word responsive to adjustment signals included in the latched command-address signals, the phase adjustment command word including information identifying a particular digital signal; and
 an up/down phase counter-controller coupled to the command decoder and sequencer to receive the phase adjustment command word, and coupled to the phase command registers, the counter-controller adjusting the value of the phase command stored in the register associated with the identified digital signal responsive to the phase adjustment command word.

18. The read synchronization circuit of claim 17 wherein the counter-controller adjusts the value of the phase command stored in each register by first reading a present value of the stored phase command, incrementing or decrementing the present value of the phase command responsive to the phase adjustment command to develop a new phase command word, and thereafter storing the new phase command in the register.

19. The read synchronization circuit of claim 16 wherein the clock generation circuit comprises:
 a programmable delay clock generator that generates N internal clock signals responsive to the read clock signal; and
 a plurality of multiplexers, each multiplexer having an output coupled to a respective clock terminal of a corresponding latch circuit, a plurality of selection inputs coupled to the associated phase command register to receive the stored phase command, and having N inputs coupled to the programmable delay clock generator to receive the N internal clock signals, each multiplexer applying a selected one of the N internal clock signals to the clock terminal of the corresponding latch responsive to the phase command.

20. The read synchronization circuit of claim 19 wherein the programmable delay clock generator comprises a delay-locked loop circuit.

21. The read synchronization circuit of claim 16 wherein each latch circuit comprises a data latch and a buffer.

22. A memory device, comprising:
 at least one array of memory cells adapted to store data at a location determined by a row address and a column address;
 a control circuit adapted to receive external control signals and operable in response to the external control signals to generate a plurality of internal control signals;
 a row address circuit adapted to receive and decode the row address, and select a row of memory cells corresponding to the row address responsive to the internal control signals;
 a column address circuit adapted to receive or apply data to at least one of the memory cells in the selected row corresponding to the column address responsive to the internal control signals;

a write data path circuit adapted to couple data between a data bus and the column address circuit responsive to the internal control signals; and a read data path circuit adapted to couple data between the data bus and the column address circuit responsive to the internal control signals, the read data path circuit comprising a read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:

a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;

a plurality of phase command registers, each phase command register storing a phase command responsive to a control signal and each register being associated with at least one of the latch circuits;

a clock generation circuit coupled to latch circuits and the phase command registers, the clock generation circuit generating a plurality of internal clock signals and the external data clock signal responsive to a read clock signal, each internal clock signal and the external clock signal having a respective phase shift relative to the read clock signal, and the clock generation circuit selecting one of the internal clock signals for each latch circuit in response to the associated phase command and applying the selected internal clock signal to the clock terminal of the latch circuit to place digital signals on the corresponding signal terminal with a timing offset determined by the phase shift of the selected internal clock signal; and a synchronization control circuit coupled to the clock generation circuit and the phase command registers, the control circuit operable in response to the initialization signals to apply synchronization digital signals on the inputs of the latch circuits and to adjust the respective timing offsets between the external data clock signal and the synchronization digital signals output by each latch circuit by adjusting the respective values of the phase commands, and storing final phase commands in each phase command register that allow the synchronization digital signals to be successfully captured responsive to the external data clock signal.

23. The memory device of claim 22 wherein the control circuit comprises:

a read data pattern generator that generates the synchronization digital signals, each bit having a repeating 15 bit pseudo-random bit sequence for the synchronization signals;

a command buffer and address capture circuit adapted to latch and output command-address signals applied on a command address bus;

a command decoder and sequencer coupled to the output of the command buffer and address capture circuit that generates a plurality of control signals responsive to the latched command-address signals, and generates a phase adjustment command word responsive to adjustment signals included in the latched command-address signals, the phase adjustment command word including information identifying a particular digital signal; and an up/down phase counter-controller coupled to the command decoder and sequencer to receive the phase adjustment command word, and coupled to the phase command registers, the counter-controller adjusting the value of the phase command stored in the register associated with the identified digital signal responsive to the phase adjustment command word.

24. The memory device of claim 23 wherein the counter-controller adjusts the value of the phase command stored in each register by first reading a present value of the stored phase command, incrementing or decrementing the present value of the phase command responsive to the phase adjustment command to develop a new phase command word, and thereafter storing the new phase command in the register.

25. The memory device of claim 22 wherein the clock generation circuit comprises:

a programmable delay clock generator that generates N internal clock signals responsive to the read clock signal; and a plurality of multiplexers, each multiplexer having an output coupled to a respective clock terminal of a corresponding latch circuit, a plurality of selection inputs coupled to the associated phase command register to receive the stored phase command, and having N inputs coupled to the programmable delay clock generator to receive the N internal clock signals, each multiplexer applying a selected one of the N internal clock signals to the clock terminal of the corresponding latch responsive to the phase command.

26. The memory device of claim 25 wherein the programmable delay clock generator comprises a delay-locked loop circuit.

27. The memory device of claim 22 wherein each latch circuit comprises a data latch and a buffer.

28. The memory device of claim 22 wherein the memory device comprises a packetized dynamic random access memory device.

29. The memory device of claim 28 wherein the packetized dynamic random access memory device comprises an SLDRAM.

30. A memory system, comprising:

a memory device, comprising, at least one array of memory cells adapted to store data at a location determined by a row address and a column address;

a control circuit adapted to receive external control signals and operable in response to the external control signals to generate a plurality of internal control signals;

a row address circuit adapted to receive and decode the row address, and select a row of memory cells corresponding to the row address responsive to the internal control signals;

a column address circuit adapted to receive or apply data to at least one of the memory cells in the selected row corresponding to the column address responsive to the internal control signals;

a write data path circuit adapted to couple data between a data bus and the column address circuit responsive to the internal control signals; and a read data path circuit adapted to couple data between the data bus and the column address circuit responsive to the internal control signals, the read data path circuit comprising a read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:

a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;

a plurality of phase command registers, each phase command register storing a phase command responsive to a control signal and each register being associated with at least one of the latch circuits;

a clock generation circuit coupled to latch circuits and the phase command registers, the clock generation circuit generating a plurality of internal clock signals and the external data clock signal responsive to a read clock signal, each internal clock signal and the external clock signal having a respective phase shift relative to the read clock signal, and the clock generation circuit selecting one of the internal clock signals for each latch circuit in response to the associated phase command and applying the selected internal clock signal to the clock terminal of the latch circuit to place digital signals on the corresponding signal terminal with a timing offset determined by the phase shift of the selected internal clock signal; and a synchronization control circuit coupled to the clock generation circuit and the phase command registers, the control circuit operable in response to the internal control signals to apply synchronization digital signals on the inputs of the latch circuits and to adjust the respective timing offsets between the external data clock signal and the synchronization digital signals output by each latch circuit by adjusting the respective values of the phase commands, and storing final phase commands in each phase command register that allow the synchronization digital signals to be successfully captured responsive to the external data clock signal; and a memory controller coupled to the memory device.

31. The memory system of claim 30 wherein the clock generation circuit comprises:

a programmable delay clock generator that generates N internal clock signals responsive to the read clock signal; and a plurality of multiplexers, each multiplexer having an output coupled to a respective clock terminal of a corresponding latch circuit, a plurality of selection inputs coupled to the associated phase command register to receive the stored phase command, and having N inputs coupled to the programmable delay clock generator to receive the N internal clock signals, each multiplexer applying a selected one of the N internal clock signals to the clock terminal of the corresponding latch responsive to the phase command.

32. The memory system of claim 31 wherein the programmable delay clock generator comprises a delay-locked loop circuit.

33. The memory system of claim 30 wherein each latch circuit comprises a data latch and a buffer.

34. The memory system of claim 30 wherein the memory device comprises a packetized dynamic random access memory device.

35. The memory system of claim 34 wherein the packetized dynamic random access memory device comprises an SLDRAM.

36. The memory system of claim 30 wherein the memory device comprises a double-data rate memory device and the external data clock signal comprises a data strobe signal DQS.

37. An integrated circuit adapted to receive a plurality of input signals and generate a plurality of output signals on respective, externally accessible terminals, comprising:

a circuit adapted to receive a plurality of input signals applied to respective other of the terminals and to generate a plurality of output signals on respective other of the terminals;

a read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:

a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;

a plurality of phase command registers, each phase command register storing a phase command responsive to a control signal and each register being associated with at least one of the latch circuits;

a clock generation circuit coupled to latch circuits and the phase command registers, the clock generation circuit generating a plurality of internal clock signals and the external data clock signal responsive to a read clock signal, each internal clock signal and the external clock signal having a respective phase shift relative to the read clock signal, and the clock generation circuit selecting one of the internal clock signals for each latch circuit in response to the associated phase command and applying the selected internal clock signal to the clock terminal of the latch circuit to place digital signals on the corresponding signal terminal with a timing offset determined by the phase shift of the selected internal clock signal; and a control circuit coupled to the clock generation circuit and the phase command registers, the control circuit operable in response to a synchronization command to apply synchronization digital signals on the inputs of the latch circuits and to adjust the respective timing offsets between the external data clock signal and the synchronization digital signals output by each latch circuit by adjusting the respective values of the phase commands, and storing final phase commands in each phase command register that allow the synchronization digital signals to be successfully captured responsive to the external data clock signal.

38. The integrated circuit of claim 37 wherein the control circuit comprises:

a read data pattern generator that generates the synchronization digital signals, each bit having a repeating 15 bit pseudo-random bit sequence for the synchronization digital signals;

a command buffer and address capture circuit adapted to latch and output command-address signals applied on a command address bus;

a command decoder and sequencer coupled to the output of the command buffer and address capture circuit that generates a plurality of control signals responsive to the latched command-address signals, and generates a phase adjustment command word responsive to adjustment signals included in the latched command-address signals, the phase adjustment command word including information identifying a particular digital signal; and an up/down phase counter-controller coupled to the command decoder and sequencer to receive the phase adjustment command word, and coupled to the phase command registers, the counter-controller adjusting the value of the phase command stored in the register associated with the identified digital signal responsive to the phase adjustment command word.

39. The integrated circuit of claim 38 wherein the counter-controller adjusts the value of the phase command stored in each register by first reading a present value of the stored phase command, incrementing or decrementing the present value of the phase command responsive to the phase adjustment command to develop a new phase command word, and thereafter storing the new phase command in the register.

40. The integrated circuit of claim 37 wherein the clock generation circuit comprises:

a programmable delay clock generator that generates N internal clock signals responsive to the read clock signal; and a plurality of multiplexers, each multiplexer having an output coupled to a respective clock terminal of a corresponding latch circuit, a plurality of selection inputs coupled to the associated phase command register to receive the stored phase command, and having N inputs coupled to the programmable delay clock generator to receive the N internal clock signals, each multiplexer applying a selected one of the N internal clock signals to the clock terminal of the corresponding latch responsive to the phase command.

41. The integrated circuit of claim 40 wherein the programmable delay clock generator comprises a delay-locked loop circuit.

42. The integrated circuit of claim 37 wherein each latch circuit comprises a data latch and a buffer.

43. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a memory device coupled to the processor, comprising, at least one array of memory cells adapted to store data at a location determined by a row address and a column address;

a control circuit adapted to receive external control signals and operable in response to the external control signals to generate a plurality of internal control signals;

a row address circuit adapted to receive and decode the row address, and select a row of memory cells corresponding to the row address responsive to the internal control signals;

a column address circuit adapted to receive or apply data to at least one of the memory cells in the selected row corresponding to the column address responsive to the internal control signals;

a write data path circuit adapted to couple data between a data bus and the column address circuit responsive to the internal control signals; and a read data path circuit adapted to couple data between the data bus and the column address circuit responsive to the internal control signals, the read data path circuit comprising a read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:

a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;

a plurality of phase command registers, each phase command register storing a phase command responsive to a control signal and each register being associated with at least one of the latch circuits;

a clock generation circuit coupled to latch circuits and the phase command registers, the clock generation circuit generating a plurality of internal clock signals and the external data clock signal responsive to a read clock signal, each internal clock signal and the external clock signal having a respective phase shift relative to the read clock signal, and the clock generation circuit selecting one of the internal clock signals for each latch circuit in response to the associated phase command and applying the selected internal clock signal to the clock terminal of the latch circuit to place digital signals on the corresponding signal terminal with a timing offset determined by the phase shift of the selected internal clock signal; and a synchronization control circuit coupled to the clock generation circuit and the phase command registers, the control circuit operable in response to the internal control signals to apply synchronization digital signals on the inputs of the latch circuits and to adjust the respective timing offsets between the external data clock signal and the synchronization digital signals output by each latch circuit by adjusting the respective values of the phase commands, and storing final phase commands in each phase command register that allow the synchronization digital signals to be successfully captured responsive to the external data clock signal.

44. The computer system of claim 43 wherein the clock generation circuit comprises:

a programmable delay clock generator that generates N internal clock signals responsive to the read clock signal; and a plurality of multiplexers, each multiplexer having an output coupled to a respective clock terminal of a corresponding latch circuit, a plurality of selection inputs coupled to the associated phase command register to receive the stored phase command, and having N inputs coupled to the programmable delay clock generator to receive the N internal clock signals, each multiplexer applying a selected one of the N internal clock signals to the clock terminal of the corresponding latch responsive to the phase command.

45. The computer system of claim 44 wherein the programmable delay clock generator comprises a delay-locked loop circuit.

46. The computer system of claim 43 wherein each latch circuit comprises a data latch and a buffer.

47. The computer system of claim 43 wherein the memory device comprises a packetized dynamic random access memory device.

48. The computer system of claim 47 wherein the packetized dynamic random access memory device comprises an SLDRAM.

49. The computer system of claim 43 wherein the memory device comprises a double-data rate memory device and the external data clock signal comprises a data strobe signal DQS.

50. A read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:
    a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;
    a plurality of phase command registers, each phase command register storing a phase command and each register being associated with one of the latch circuits;
    a programmable delay clock generator that develops N internal clock signals responsive to the read clock signal;
    a plurality of multiplexers, each multiplexer having an output coupled to a respective clock terminal of a corresponding latch circuit, a plurality of selection inputs coupled to an associated phase command register to receive the stored phase command, and N inputs coupled to the generator to receive the N internal clocks signals, respectively, the multiplexer applying a selected internal clock signal on the output to clock the corresponding latch circuit in response to the phase command;
    a read data pattern generator coupled to the inputs of the latch circuits, the generator applying a synchronization signal to each input; and
    an up/down phase counter-controller coupled to the read data pattern generator and the phase command registers, the counter-controller operable to adjust the values of the phase commands stored in the registers in response to received phase adjustment command words to thereby adjust the respective timing offsets between the external data clock signal and the synchronization signal being output by the latch circuits, and the counter-controller storing final phase commands in each phase command register that allow the synchronization digital signals to be successfully captured responsive to the external data clock signal.

51. The read synchronization circuit of claim 50 wherein the counter-controller adjusts the value of the phase command stored in each register by first reading a present value of the stored phase command, incrementing or decrementing the present value of the phase command responsive to the phase adjustment command to develop a new phase command word, and thereafter storing the new phase command in the register.

52. The read synchronization circuit of claim 50 wherein the programmable delay clock generator comprises a delay-locked loop circuit.

53. The read synchronization circuit of claim 50 wherein each latch circuit comprises a data latch and a buffer.

54. A read synchronization circuit that adaptively adjusts respective timing offsets of a plurality of digital signals applied on respective signal terminals and an external data clock signal to enable an external device to latch the digital signals responsive to the external data clock signal, the read synchronization circuit comprising:
    a plurality of data storage means for storing respective signals and providing the stored signals on respective signal terminals, each data storage means storing the signal applied on an input and providing the stored signal on the corresponding signal terminal responsive to a clock signal;
    a plurality of phase storage means for storing respective phase commands, each phase storage means being associated with one of the data storage means;
    a clock generation means coupled to the data storage means and the phase storage means for generating a plurality of internal clock signals and the external data clock signal responsive to a read clock signal, each internal clock signal and the external clock signal having a respective phase shift relative to the read clock signal, and the clock generation means including selection means for selecting one of the internal clock signals for each data storage means in response to the associated phase command and applying the selected internal clock signal as the clock signal to the data storage means to place digital signals on the corresponding signal terminal with a timing offset determined by the phase shift of the selected internal clock signal; and
    a control means coupled to the clock generation means and the phase storage means for receiving a synchronization command and, in response to the synchronization command, applying a respective synchronization digital signals to each storage means and adjusting the respective timing offsets between the external data clock signal and each of the synchronization digital signals being provided on the signal terminals by each storage means by adjusting the respective values of the phase commands stored in the phase storage means, and storing final phase commands in each phase storage means that allow the synchronization digital signals to be successfully captured responsive to the external data clock signal.

55. The read synchronization circuit of claim 54 wherein the control means comprises:
    a data pattern generation means for generating the synchronization digital signals, each signal being a repeating pseudo-random bit sequence;
    a command buffering and address capturing means for latching command-address signals applied on a command address bus;
    a command decoding and sequencing means coupled to the command buffering and address capturing means for generating a plurality of control signals responsive to the latched command-address signals, and generating a phase adjustment command word responsive to adjustment signals included in the latched command-address signals, the phase adjustment command word including information identifying a particular digital signal; and a phase counter-controller means coupled to the command decoding and sequencing means to receive the phase adjustment command word and coupled to the phase storage means, the counter-controller means adjusting the value of the phase command stored in the phase storage means associated with the identified digital signal responsive to the phase adjustment command word.

56. The read synchronization circuit of claim 55 wherein the counter-controller means adjusts the value of the phase command stored in each phase storage means by first reading a present value of the stored phase command, incrementing or decrementing the present value of the phase command responsive to the phase adjustment command to develop a new phase command word, and thereafter storing the new phase command in the phase storage means.

57. The read synchronization circuit of claim 54 wherein the clock generation means comprises:

a programmable delay clock generation means for generating N internal clock signals responsive to the read clock signal; and a plurality of multiplexing means, each multiplexing means having an output coupled to a corresponding data storage means to apply the clock signal to the storage means and including a plurality of selection inputs coupled to the associated phase storage means to receive the stored phase command, and having N inputs coupled to the programmable delay clock generation means to receive the N internal clock signals, each multiplexing means applying a selected one of the N internal clock signals to the clock terminal of the corresponding data storage means responsive to the phase command.

58. The read synchronization circuit of claim 57 wherein the programmable delay clock generation means comprises a delay-locked loop means.

59. The read synchronization circuit of claim 54 wherein each data storage means comprises a latching means for storing data and a buffer means coupled to the latching means for providing the stored data on the corresponding signal terminal.

60. A memory system, comprising:

a system clock generator that develops a system read data clock signal;

a memory device coupled to the clock generator to receive the system read data clock signal, comprising, at least one array of memory cells adapted to store data at a location determined by a row address and a column address;

a control circuit adapted to receive external control signals and operable in response to the external control signals to generate a plurality of internal control signals;

a row address circuit adapted to receive and decode the row address, and select a row of memory cells corresponding to the row address responsive to the internal control signals;

a column address circuit adapted to receive or apply data to at least one of the memory cells in the selected row corresponding to the column address responsive to the internal control signals;

a write data path circuit adapted to couple data between a data bus and the column address circuit responsive to the internal control signals; and a read data path circuit adapted to couple data between the data bus and the column address circuit responsive to the internal control signals, the read data path circuit comprising a read synchronization circuit that adaptively adjusts respective timing offsets of a plurality of digital signals applied on respective signal terminals and the system read data clock signal to enable an external device to latch the digital signals responsive to the system read data clock signal, the read synchronization circuit comprising:

a plurality of latch circuits, each latch circuit including an input, an output coupled to a respective signal terminal, and a clock terminal, and each latch circuit storing a signal applied on the input and providing the stored signal on the signal terminal responsive to a clock signal applied on the clock terminal;

a plurality of phase command registers, each phase command register storing a phase command responsive to a control signal and each register being associated with at least one of the latch circuits;

an internal clock generation circuit coupled to latch circuits and the phase command registers, the internal clock generation circuit generating a plurality of internal clock signals responsive to the system read data clock signal, each internal clock signal and the system read data clock signal having a respective phase shift relative to the system read data clock signal, and the internal clock generation circuit selecting one of the internal clock signals for each latch circuit in response to the associated phase command and applying the selected internal clock signal to the clock terminal of the latch circuit to place digital signals on the corresponding signal terminal with a timing offset determined by the phase shift of the selected internal clock signal; and a synchronization control circuit coupled to the internal clock generation circuit and the phase command registers, the control circuit operable in response to the internal control signals to apply synchronization digital signals on the inputs of the latch circuits and to adjust the respective timing offsets between the system read data clock signal and the synchronization digital signals output by each latch circuit by adjusting the respective values of the phase commands, and storing final phase commands in each phase command register that allow the synchronization digital signals to be successfully captured responsive to the system read data clock signal; and a memory controller coupled to the memory device and coupled to the system read clock generator to receive the system read data clock signal.

61. The memory system of claim 60 wherein the clock generation circuit comprises:

a programmable delay clock generator that generates N internal clock signals responsive to the read clock signal; and a plurality of multiplexers, each multiplexer having an output coupled to a respective clock terminal of a corresponding latch circuit, a plurality of selection inputs coupled to the associated phase command register to receive the stored phase command, and having N inputs coupled to the programmable delay clock generator to receive the N internal clock signals, each multiplexer applying a selected one of the N internal clock signals to the clock terminal of the corresponding latch responsive to the phase command.

62. The memory system of claim 61 wherein the programmable delay clock generator comprises a delay-locked loop circuit.

63. The memory system of claim 60 wherein each latch circuit comprises a data latch and a buffer.

64. The memory system of claim 60 wherein the memory device comprises a packetized dynamic random access memory device.

65. The memory system of claim 64 wherein the packetized dynamic random access memory device comprises an SLDRAM.

66. The memory system of claim 60 wherein the memory device comprises a double-data rate memory device and the external data clock signal comprises a data strobe signal DQS.

* * * * *

UNITED STATES PATENT AND TRADEMARK OFFICE
CERTIFICATE OF CORRECTION

PATENT NO.       : 6,801,989 B2
APPLICATION NO.  : 09/896030
DATED            : October 5, 2004
INVENTOR(S)      : Brian Johnson and Ronnie M. Harrison It is certified that error appears in the above-identified patent and that said Letters Patent is hereby corrected as shown below:

| On the Title Page | Reads | Should Read |
|---|---|---|
| Item (*) | "Notice: Subject to any disclaimer, the term of this patent is extended or adjusted under 35 U.S.C. 154(b) by 155 days." | --Notice: Subject to any disclaimer, the term of this patent is extended or adjusted under 35 U.S.C. 154(b) by 247 days.-- |
| On the Title Page Item (56), References Cited, U.S. Patent Documents | [Omitted references] | --5,120,990 6/1992 Koker.....307/269<br>5,424,687 6/1995 Fukuda.....331/11<br>5,515,403 5/1996 Sloan et al.....375/371<br>5,550,515 8/1996 Liang et al.....331/11<br>5,945,855 8/1999 Momtaz.....327/157<br>5,953,386 9/1999 Anderson.....375/376<br>6,115,318 9/2000 Keeth.....365/233<br>6,173,432 B1 1/2001 Harrison.....716/1<br>6,438,043 B2 8/2002 Gans et al.....365/194<br>6,442,644 B1 8/2002 Gustavson et al...711/105<br>6,665,222 B2 12/2003 Wright et al....365/203-- |
| On the Title Page Item (56), References Cited, U.S. Patent Documents | [Omitted references] | --Alvarez, J. et al. "A Wide-Bandwidth Low Voltage PLL for Power PC$^{TM}$ Microprocessors" IEEE IEICE Trans. Electron., Vol. E-78, No. 6, June 1995, pp. 631-639.-- |
| On the Title Page Item (56), References Cited, U.S. Patent Documents, Santos Reference | "Santos, D. et al., "CMOS Delay Locked Loop And Sub-Nanosecond Time-to-Digital" | --Santos, D. et al., "CMOS Delay Locked Loop and Sub-Nanosecond Time-to-Digital-- |
| On the Title Page Item (56), References Cited, U.S. Patent Documents, Taguchi Reference | "Taguchi, M. et al. "40-ns 64-Mb DRAM" | --Taguchi, M. et al., "A 40-ns 64-Mb DRAM-- |

UNITED STATES PATENT AND TRADEMARK OFFICE
CERTIFICATE OF CORRECTION

PATENT NO. : 6,801,989 B2
APPLICATION NO. : 09/896030
DATED : October 5, 2004
INVENTOR(S) : Brian Johnson and Ronnie M. Harrison It is certified that error appears in the above-identified patent and that said Letters Patent is hereby corrected as shown below:

| On the Title Page | Reads | Should Read |
|---|---|---|
| Item (56), References Cited, U.S. Patent Documents, Second Tanoi Reference | "vol.E-79-C. No. 7," | --Vol. E-179-C, No. 7,-- |
| Item (56), References Cited, U.S. Patent Documents, Kim Reference | "Using a Skew Cancelleation Technique"," | --Using a Skew Cancellation Technique,"-- |
| On the Title Page Item (57), Line 1 | "circuit adaptively" | --circuit to adaptively-- |

| Column, Line | Reads | Should Read |
|---|---|---|
| Column 2, Line 37 | "operator or an electronic" | --operator of an electronic-- |
| Column 2, Line 43 | "and a video" | --and video-- |
| Column 2, Line 49 | "drives floppy disk drives," | --drives, floppy disk drives,-- |
| Column 5, Line 53 | "they may loose" | --they may lose-- |
| Column 7, Line 44 | "valid after timing" | --valid after the timing-- |
| Column 12, Line 24 | "synchronized. contains" | --synchronized and contains-- |
| Column 13, Line 50 | "word store" | --word stored-- |
| Column 13, Lines 57-58 | "applied data word" | --and applies data word-- |
| Column 13, Line 59 | "The Memory controller" | --The memory controller-- |
| Column 14, Line 13 | "as determined the" | --as determined by the-- |
| Column 14, Line 63 | "described develop" | --described to develop-- |
| Column 15, Line 46 | "between the each bit" | --between each bit-- |

UNITED STATES PATENT AND TRADEMARK OFFICE
CERTIFICATE OF CORRECTION

PATENT NO. : 6,801,989 B2
APPLICATION NO. : 09/896030
DATED : October 5, 2004
INVENTOR(S) : Brian Johnson and Ronnie M. Harrison It is certified that error appears in the above-identified patent and that said Letters Patent is hereby corrected as shown below:

| Column, Line | Reads | Should Read |
|---|---|---|
| Column 15, Line 57 | "DCLK0, signal" | --DCLK0 signal-- |
| Column 16, Lines 48, 50, 54 and 57 | "time to." | --time $t_0$.-- |
| Column 17, Line 48 | "In addition, in addition" | --In addition,-- |
| Column 18, Line 11 | "a read operations," | --a read operation,-- |
| Column 18, Line 29 | "are non packetized" | --are non-packetized-- |
| Column 18, Line 47 | "the signal" | --signal-- |
| Column 19, Line 46 | "line to adjusting" | --line to adjust-- |
| Column 29, Line 46 | "internal clocks" | --internal clock-- |
| Column 30, Line 47 | "digital signals" | --digital signal-- |

Signed and Sealed this

Sixteenth Day of September, 2008

JON W. DUDAS
*Director of the United States Patent and Trademark Office*